(12) United States Patent
Kreupl

(10) Patent No.: US 7,768,016 B2
(45) Date of Patent: Aug. 3, 2010

(54) CARBON DIODE ARRAY FOR RESISTIVITY CHANGING MEMORIES

(75) Inventor: Franz Kreupl, Munich (DE)

(73) Assignee: Qimonda AG (DE)

( * ) Notice: Subject to any disclaimer, the term of this patent is extended or adjusted under 35 U.S.C. 154(b) by 178 days.

(21) Appl. No.: 12/029,397

(22) Filed: Feb. 11, 2008

(65) Prior Publication Data

US 2009/0201715 A1    Aug. 13, 2009

(51) Int. Cl.
*H01L 29/72* (2006.01)

(52) U.S. Cl. .................. 257/76; 257/485; 257/613; 257/E21.004; 365/148

(58) Field of Classification Search .............. 365/148; 257/76, 485, 613, E21.004
See application file for complete search history.

(56) References Cited

U.S. PATENT DOCUMENTS

| | | | |
|---|---|---|---|
| 3,361,638 A | 1/1968 | Bokros et al. | |
| 3,692,565 A | 9/1972 | Lersmacher et al. | |
| 4,262,039 A | 4/1981 | Gyarmati et al. | |
| 4,599,705 A | 7/1986 | Holmberg et al. | |
| 5,086,014 A | 2/1992 | Miyata et al. | |
| 5,211,796 A | 5/1993 | Hansen | |
| 5,278,431 A | 1/1994 | Das | |
| 5,294,518 A | 3/1994 | Brady et al. | |
| 5,330,630 A | 7/1994 | Klersy et al. | |
| 5,341,328 A | 8/1994 | Ovshinsky et al. | |
| 5,440,507 A | 8/1995 | Brady et al. | |
| 6,139,624 A | 10/2000 | Rupp | |
| 6,180,444 B1 | 1/2001 | Gates et al. | |
| 6,194,746 B1 | 2/2001 | Gonzalez et al. | |
| 6,235,645 B1 | 5/2001 | Habuka et al. | |
| 6,392,913 B1 * | 5/2002 | Sandhu | 365/105 |
| 6,750,469 B2 | 6/2004 | Ichihara et al. | |
| 6,903,361 B2 | 6/2005 | Gilton | |
| 6,937,505 B2 | 8/2005 | Morikawa | |
| 2005/0127524 A1 | 6/2005 | Sakamoto et al. | |
| 2006/0038212 A1 | 2/2006 | Moore et al. | |
| 2006/0152961 A1 | 7/2006 | Kim et al. | |
| 2007/0045615 A1 | 3/2007 | Cho et al. | |
| 2008/0070162 A1 * | 3/2008 | Ufert | 430/290 |

FOREIGN PATENT DOCUMENTS

| | | |
|---|---|---|
| CN | 1466218 A | 1/2004 |
| DE | 43 19 268 A1 | 12/1993 |
| DE | 692 14 846 T2 | 2/1997 |
| DE | 198 56 295 C2 | 6/2002 |
| DE | 103 06 076 A1 | 8/2004 |
| DE | 103 45 393 A1 | 5/2005 |
| DE | 10 2004 006 544 B3 | 9/2005 |

(Continued)

OTHER PUBLICATIONS

Aichmayr, G., et al., "Carbon / high-k Trench Capacitor for the 40nm DRAM Generation," 2007 IEEE Symposium on VLSI Technology, Jun. 12-14, 2007, pp. 186-187, IEEE.

(Continued)

*Primary Examiner*—Edward Wojciechowicz

(57) ABSTRACT

An integrated circuit and method for manufacturing an integrated circuit are described. In one embodiment, the integrated circuit includes a memory cell including a resistivity changing memory element and a carbon diode electrically coupled to the resistivity changing memory element.

23 Claims, 28 Drawing Sheets

FOREIGN PATENT DOCUMENTS

| | | |
|---|---|---|
| DE | 10 2004 011 363 A1 | 9/2005 |
| EP | 0 269 225 A2 | 6/1988 |
| EP | 0 457 508 A2 | 11/1991 |
| EP | 0 519 472 A2 | 12/1992 |
| EP | 0 714 136 A1 | 5/1996 |
| EP | 1 892 722 A1 | 2/2008 |
| JP | 05-315595 | 11/1993 |
| KR | 10-2004-0111563 A | 12/2004 |
| KR | 10-0630437 B1 | 9/2006 |
| WO | WO 98/45847 | 10/1998 |
| WO | WO 2004/070735 A1 | 8/2004 |
| WO | WO 2005/081296 A1 | 9/2005 |

OTHER PUBLICATIONS

Aichmayr, G., et al., "Carbon/High-k Trench Capacitor for the 40nm DRAM Generation," Symposium on VLSI Technology Digest of Technical Papers, 2007, pp. 186-187.

Lu, W., et al., "Ohmic Contact Behavior of Carbon Films on SIC," Journal of The Electrochemical Society, Jan. 23, 2003, pp. G177-G182.

Davanloo, F., et al., "Amorphic Diamond/Silicon Semiconductor Heterojunctions Exhibiting Photoconductive Characteristics," Applied Physics Letters, American Institute of Physics, Sep. 18, 2000, vol. 77, No. 12., pp. 1837-1839.

Oberlin, A., "Pyrocarbons," Elsevier Science Ltd., Carbon 40, May 15, 2001, pp. 7-24.

Raghavan, G., et al., "Polycrystalline Carbon: A Novel Material for Gate Electrodes in MOS Technology," Japan Journal of Applied Physics, Jan. 1993, pp. 380-383, vol. 32, Part 1, No. 1B.

Bhattacharyya, S., et al., "Resonant tunnelling and fast switching in amorphous-carbon quantum-well structures," Nature Materials, Jan. 2006, pp. 19-22, vol. 5, www.nature.com/naturematerials, Nature Publishing Group.

Savvides, N., "Four-fold to three-fold transition in diamond-like amorphous carbon films: A study of optical and electrical properties," Journal of Applied Physics, Jul. 1, 1985, pp. 518-521, vol. 58 (1), American Institute of Physics.

Liu, L., et al., "Controllable Reversibility of an $sp^2$ to $sp^3$ Transition of a Single Wall Nanotube under the Manipulation of an AFM Tip: A Nanoscale Electromechanical Switch?," Physical Review Letters, vol. 84, No. 21, May 22, 2000, pp. 4950-4953.

Gerstner, E.G., "Bistability in a-C for memory and antifuse applications," Jun. 2001, pp. 318-323.

McKenzie, D. R., et al., "Applications of tetrahedral amorphous carbon in limited volatility memory and in field programmable gate arrays," Diamond and Related Materials, vol. 10, 2001, pp. 230-233.

Takai, K. et al., "Structure and Electronic Properties of a Nongraphitic Disordered Carbon System and its Heat-Treatment Effects," Physical Review B 67, Jun. 19, 2003, pp. 1-11.

Seo, S. et al., "Reproducible Resistance Switching in Polycrystalline NiO Films," Applied Physics Letters, vol. 85, No. 23, Dec. 6, 2004, pp. 5655-5657.

Hiatt, W.R. et al., "Bistable Switching in Niobium Oxide Diodes," Applied Physics Letters, vol. 6, No. 6, Mar. 15, 1965, pp. 106-108.

Gibbons, J.F. et al., "Switching Properties of Thin NiO Films," Solid-State Electronics, vol. 7, Mar. 30, 1964, pp. 785-797.

Argall, F., "Switching Phenomena in Titanium Oxide Thin Films," Solid-State Electronics, vol. 11, Jul. 27, 1967, pp. 535-541.

Seo, S. et al., "Conductivity Switching Characteristics and Reset Currents in NiO Films," Applied Physics Letters 86, Feb. 25, 2005, pp. 1-3.

Baek, I.G. et al., "Highly Scalable Non-Volatile Resistive Memory Using Simple Binary Oxide Driven by Asymmetric Uni-polar Voltage Pulses," IEDM 2004, 26 pages.

Gerstner, E.G. et al., "Nonvolatile Memory Effects in Nitrogen Doped Tetrahedral Amorphous Carbon Thin Films," Journal of Applied Physics, vol. 84, No. 10, Nov. 15, 1998, pp. 5647-5651.

\* cited by examiner

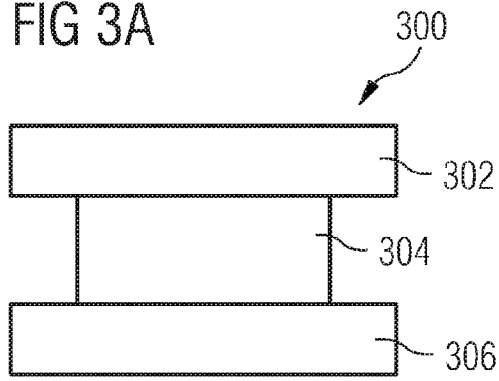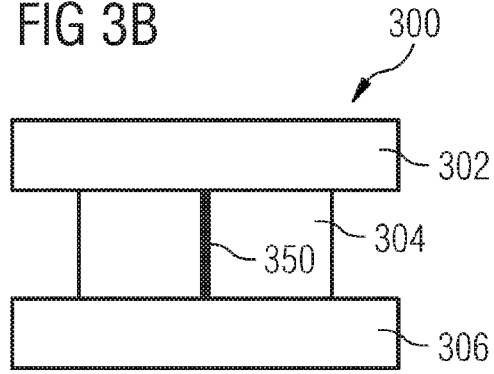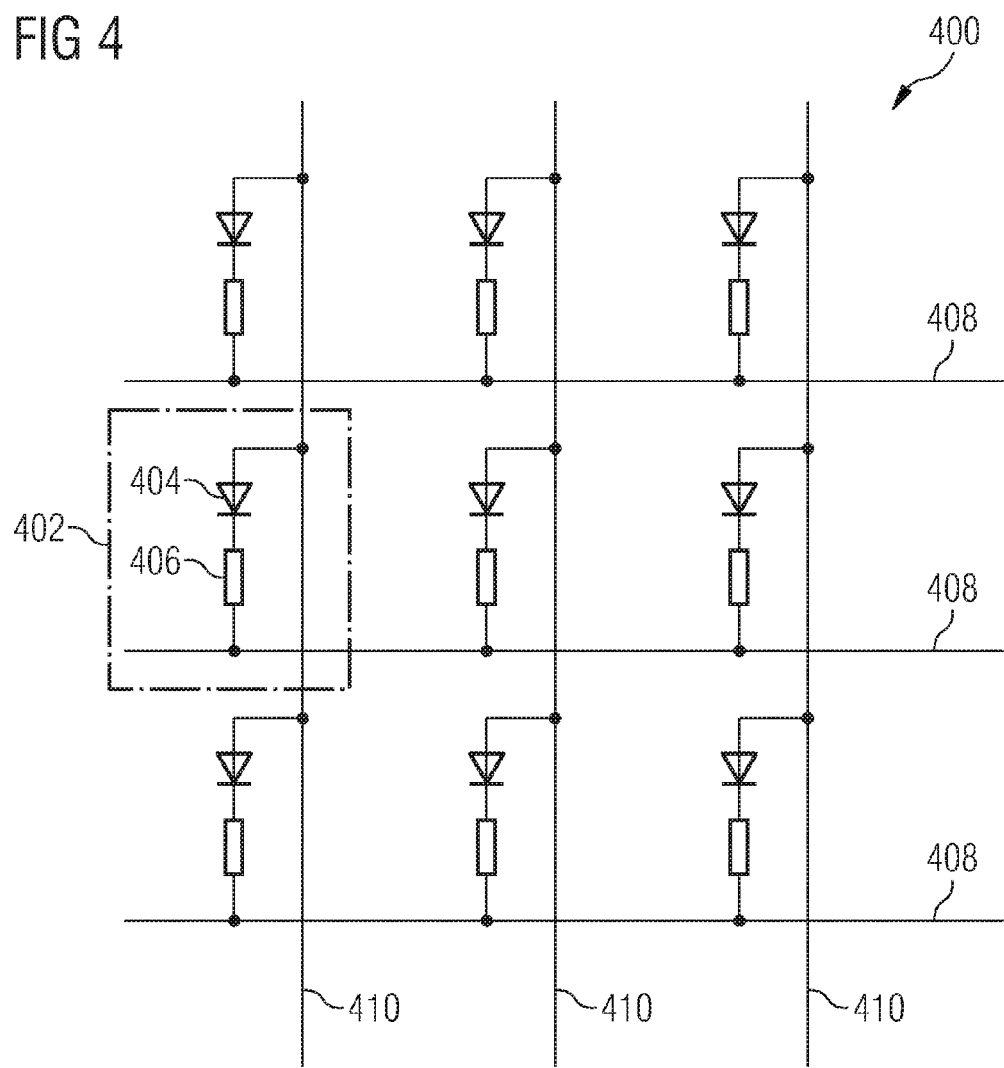

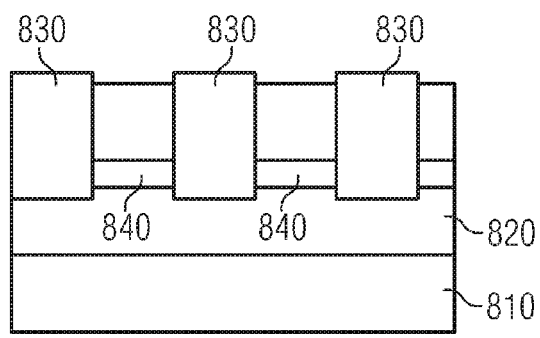
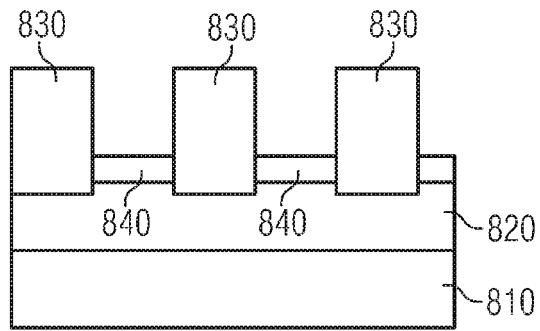
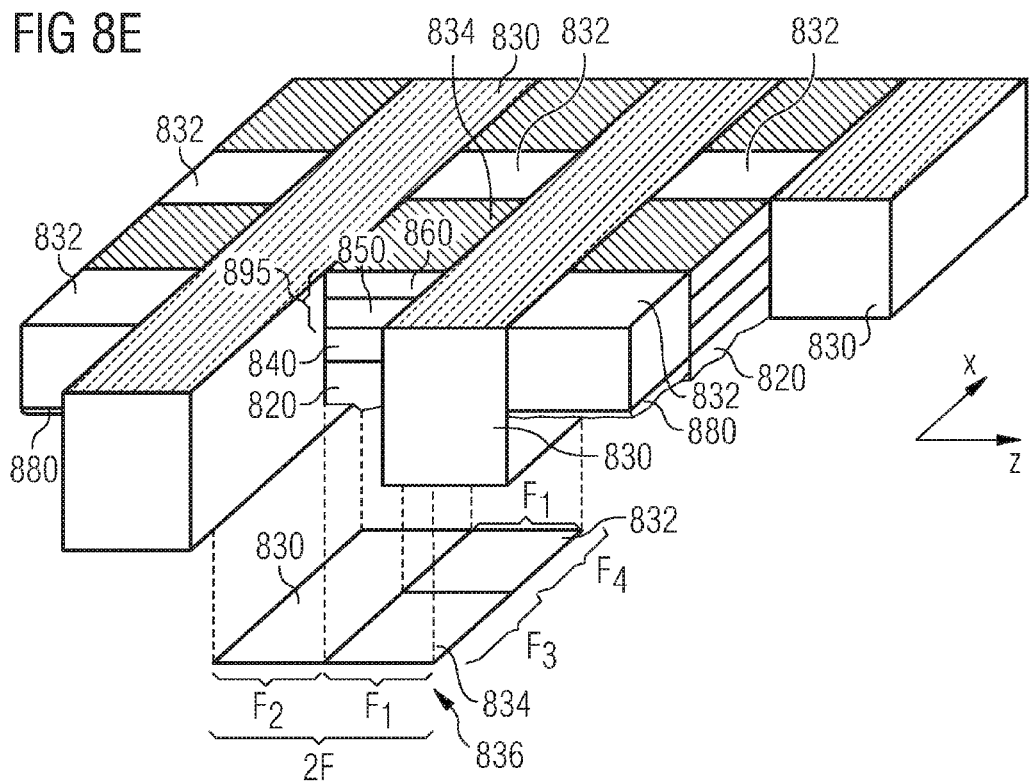

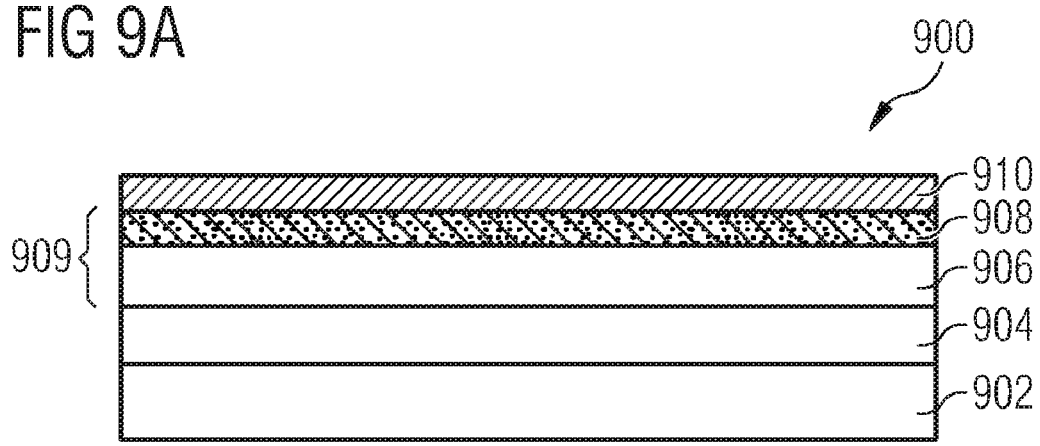
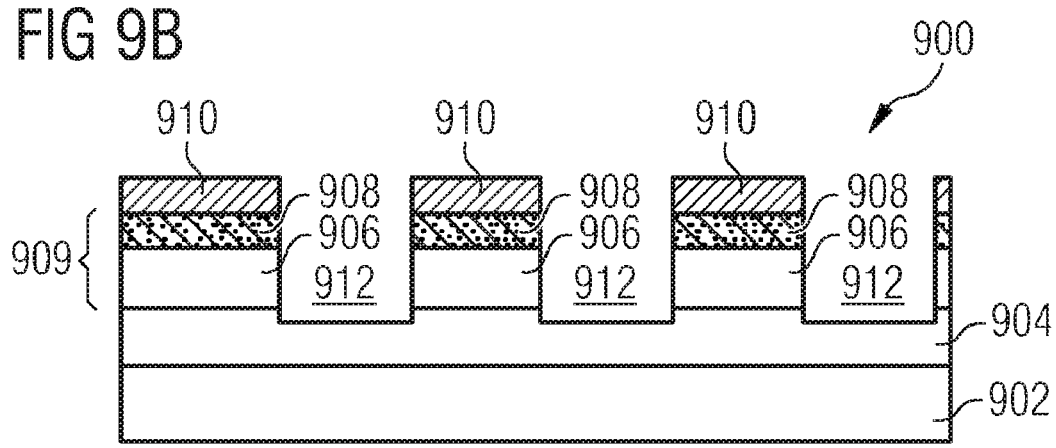
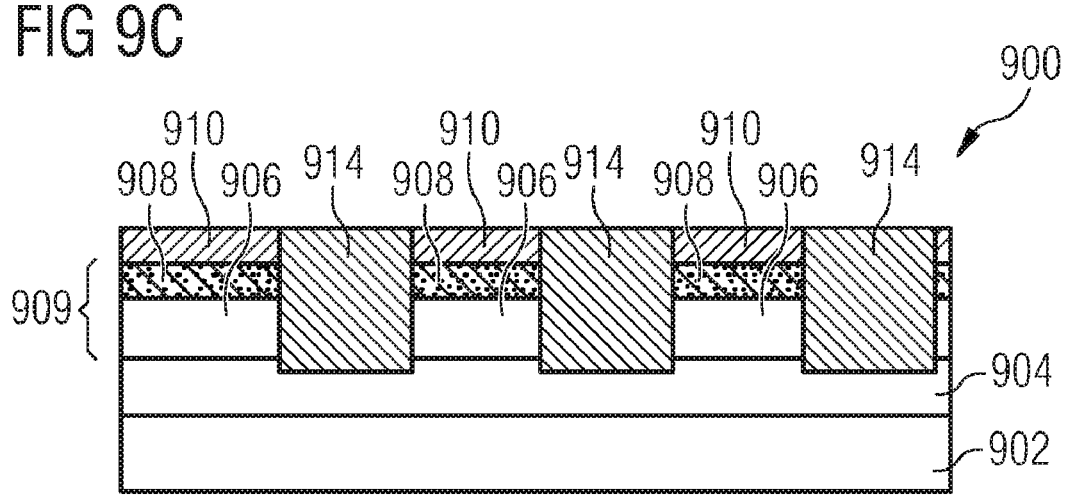

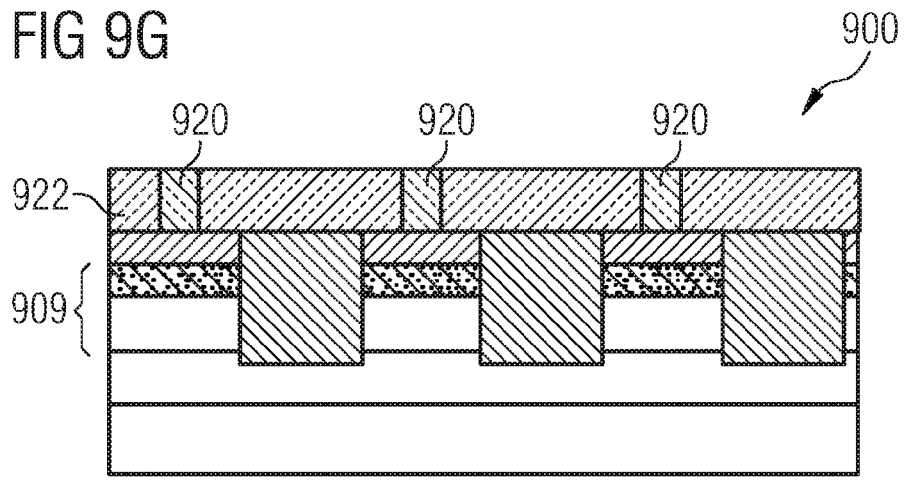
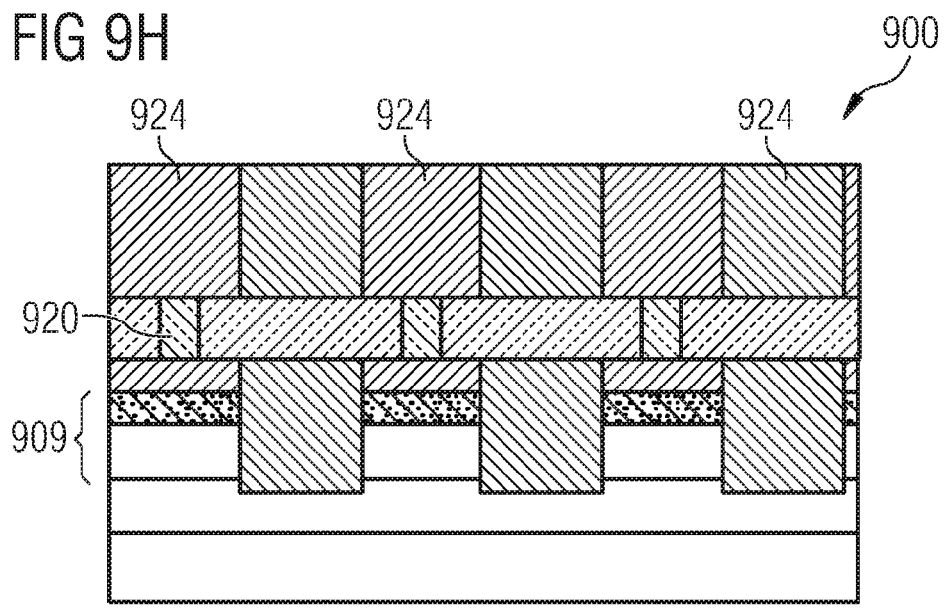
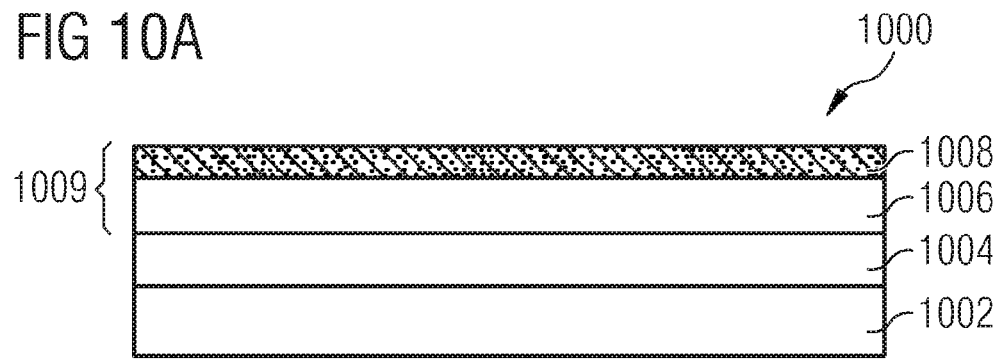

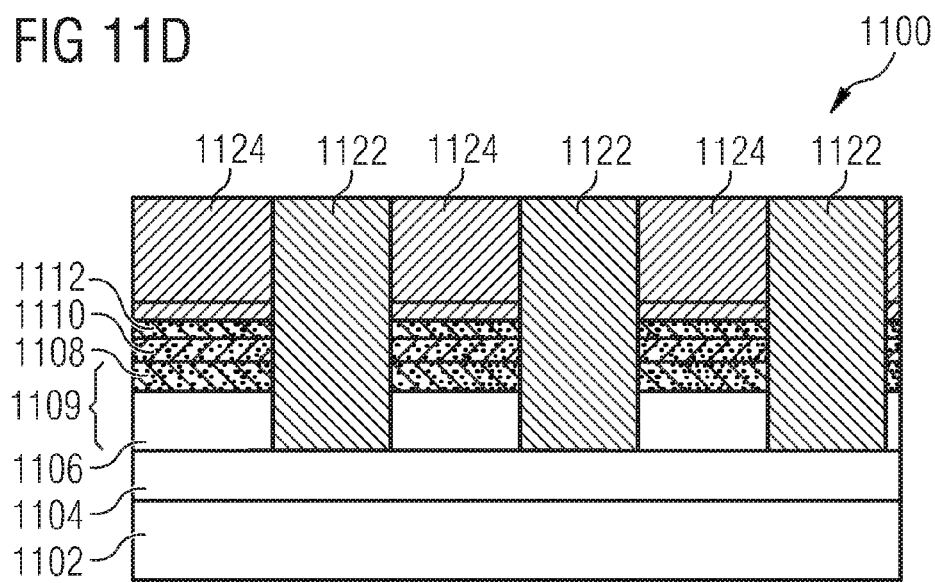
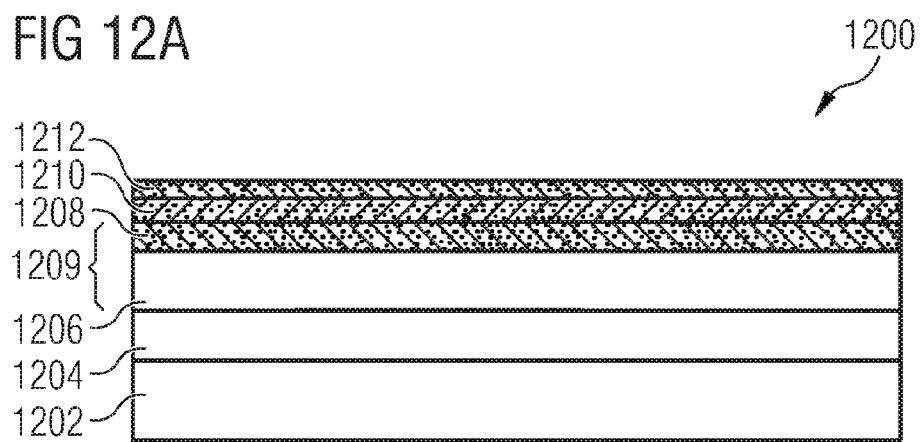
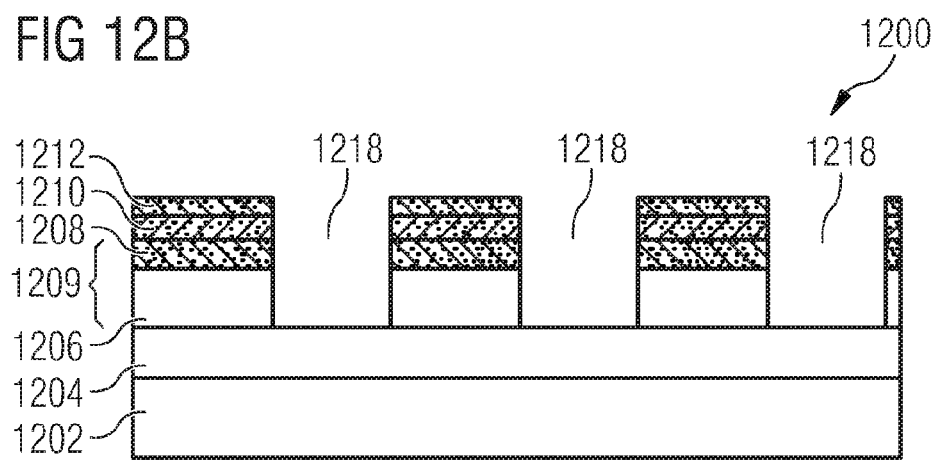

CARBON DIODE ARRAY FOR RESISTIVITY CHANGING MEMORIES

BACKGROUND

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which uses a charge to store information.

Various memory types are commonly used to digitally store a substantial amount of data. DRAMs have moderate cost, are very fast and can have access times on the order of tens of nanoseconds, but lose the stored data upon loss of electrical power, i.e., they are "volatile." Present "flash" memories are non-volatile, are more expensive perhaps by a factor of ten, and have access times from tens of nanoseconds up to near a microsecond. Hard-disk drives are substantially lower in cost than DRAMs, are non-volatile, but have access times generally greater than a millisecond. Further application considerations for each technology include limitations on the number of times a memory cell can be written or read before it deteriorates, how long it reliably retains data, its data storage density, how much energy it consumes, the need for integral mechanical devices, and the complexity and expense of associated circuitry. Considering these limitations, there is now no ideal technology for general applications. Magnetic random access memory (MRAM) as described below appears to have properties that position it well for widely accepted digital memory applications, overcoming many of these limitations.

Spin electronics, which combines semiconductor technology and magnetics, is a relatively recent development in semiconductor memory devices. The spin of an electron, rather than the charge, is used to indicate the presence of a logic "1" or "0". One such spin electronic device is a resistive memory device referred to as a magnetic random access memory, which includes conductive lines positioned perpendicular to one another in different metal layers, the conductive lines sandwiching a magnetic stack which functions as a memory cell. The place where the conductive lines intersect is called a cross-point. A current flowing through one of the conductive lines generates a magnetic field around the conductive line and orients the magnetic polarity of one layer of the magnetic stack. A current flowing through the other conductive line induces a superimposed magnetic field and can partially turn the magnetic polarity, also. Digital information, represented as a "0" or "1", is storable in the alignment of magnetic moments in the magnetic stack. The resistance of the magnetic stack depends on the moment's alignment. The stored state is read from the magnetic stack by detecting the component's resistive state. An array of memory cells may be constructed by placing the conductive lines in a matrix structure having rows and columns, with the magnetic stack being placed at the intersection of the conductive lines.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A and 3B illustrate the operation of a carbon memory cell;

FIG. 4 shows an array of memory elements according to an embodiment of the invention;

FIGS. 8A-8E illustrate the fabrication of a representative memory array in a double STI configuration, in accordance with various embodiments of the invention;

FIGS. 9A-9H show the formation of another memory device in accordance with an embodiment of the invention;

FIGS. 10A-10G show the formation of a memory device in accordance with an embodiment of the invention;

FIGS. 11A-11D show the formation of another embodiment, in which a carbon resistivity changing memory element is used;

FIGS. 12A-12D show the formation of another embodiment, in which a carbon memory us used without an additional metal plate;

DETAILED DESCRIPTION OF ILLUSTRATIVE EMBODIMENTS

Figure 1:
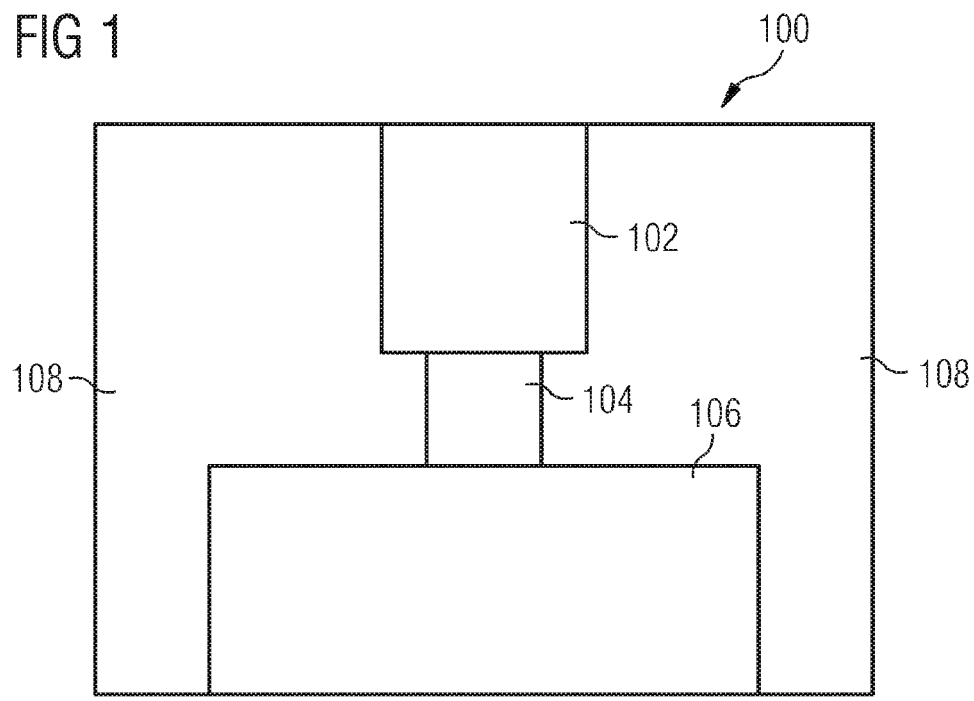
FIG. 1 shows a conventional phase changing (PCRAM) memory element.

Memory devices are used in essentially all computing applications and in many electronic devices. For some applications, non-volatile memory, which retains its stored data even when power is not present, may be used. For example, non-volatile memory is typically used in digital cameras, portable audio players, wireless communication devices, personal digital assistants, and peripheral devices, as well as for storing firmware in computers and other devices.

A variety of memory technologies have been developed. Non-volatile memory technologies include flash memory, magnetoresistive random access memory (MRAM), phase change random access memory (PCRAM), and conductive bridging random access memory (CBRAM). Due to the great demand for memory devices, researchers are continually improving memory technology and developing new types of memory, including new types of non-volatile memory.

The scale of electronic devices is constantly being reduced. For memory devices, conventional technologies, such as flash memory and DRAM, which store information based on storage of electric charges, may reach their scaling limits in the foreseeable future. Additional characteristics of these technologies, such as the high switching voltages and limited number of read and write cycles of flash memory, or the limited duration of the storage of the charge state in DRAM, pose additional challenges. To address some of these issues, researchers are investigating memory technologies that do not use storage of an electrical charge to store information. One such technology is resistivity changing memory, which stores information based on changes in the resistivity of a memory element. Depending on the resistivity changing memory technology being used, the resistivity of the storage layer is typically switched between a low resistivity state and a high resistivity state through the application of voltage or current across the storage layer.

One type of resistivity changing memory is known as phase change random access memory (PCRAM). The resistivity changing memory elements used in PCRAM are phase changing memory elements that include a phase changing material. The phase changing material can be switched between at least two different crystallization states (i.e. the phase changing material may adopt at least two different degrees of crystallization), wherein each crystallization state may be used to represent a memory state. When the number of possible crystallization states is two, the crystallization state having a high degree of crystallization is also referred to as "crystalline state", whereas the crystallization state having a low degree of crystallization is also referred to as "amorphous state". Different crystallization states can be distinguished from each other by their differing electrical properties, and in particular by their different resistances. For example, a crystallization state having a high degree of crystallization (ordered atomic structure) generally has a lower resistance than a crystallization state having a low degree of crystallization (disordered atomic structure). For sake of simplicity, it will be assumed in the following that the phase changing material can adopt two crystallization states (an "amorphous state" and a "crystalline state"), however it will be understood that additional intermediate states also may be used.

Phase changing memory elements may change from the amorphous state to the crystalline state (and vice versa) due to temperature changes of the phase changing material. These temperature changes may be caused using different approaches. For example, a current may be driven through the phase changing material (or a voltage may be applied across the phase changing material). Alternatively, a current or a voltage may be fed to a resistive heater which is disposed adjacent to the phase changing material. To determine the memory state of a resistivity changing memory element, a sensing current may routed through the phase changing material (or a sensing voltage may be applied across the phase changing material), thereby sensing the resistivity of the resistivity changing memory element, which represents the memory state of the memory element.

FIG. 1 illustrates a cross-sectional view of an exemplary phase changing memory element 100 (active-in-via type). The phase changing memory element 100 includes a first electrode 102, a phase changing material 104, a second electrode 106, and an insulating material 108. The phase changing material 104 is laterally enclosed by the insulating material 108. To use the phase changing memory element in a memory cell, a selection device (not shown), such as a transistor, a diode, or another active device, may be coupled to the first electrode 102 or to the second electrode 106 to control the application of a current or a voltage to the phase changing material 104 via the first electrode 102 and/or the second electrode 106. To set the phase changing material 104 to the crystalline state, a current pulse and/or voltage pulse may be applied to the phase changing material 104, wherein the pulse parameters are chosen such that the phase changing material 104 is heated above its crystallization temperature, while keeping the temperature below the melting temperature of the phase changing material 104. To set the phase changing material 104 to the amorphous state, a current pulse and/or voltage pulse may be applied to the phase changing material 104, wherein the pulse parameters are chosen such that the phase changing material 104 is quickly heated above its melting temperature, and is quickly cooled.

The phase changing material 104 may include a variety of materials. According to one embodiment, the phase changing material 104 may include or consist of a chalcogenide alloy that includes one or more elements from group VI of the periodic table. According to another embodiment, the phase changing material 104 may include or consist of a chalcogenide compound material, such as GeSbTe, SbTe, GeTe or AgInSbTe. According to a further embodiment, the phase changing material 104 may include or consist of chalcogen free material, such as GeSb, GaSb, InSb, or GeGaInSb. According to still another embodiment, the phase changing material 104 may include or consist of any suitable material including one or more of the elements Ge, Sb, Te, Ga, Bi, Pb, Sn, Si, P, O, As, In, Se, and S.

According to one embodiment, at least one of the first electrode 102 and the second electrode 106 may include or consist of Ti, V, Cr, Zr, Nb, Mo, Hf, Ta, W, Cu, Al, or different layers, mixtures, or alloys thereof. According to another embodiment, at least one of the first electrode 102 and the second electrode 106 may include or consist of Ti, V, Cr, Zr, Nb, Mo, Hf. Ta, W, Cu, Al and two or more elements selected from the group consisting of B, C, N, O, Al, Si, P, S, and/or mixtures, different layers, and alloys thereof. Examples of such materials include TiCN, TiAlN, TiSiN, W—Al$_2$O$_3$, Cr—Al$_2$O$_3$, Ta/Cu, TaN/Cu, TiN/Al, and Ti/Al.

Figure 2:
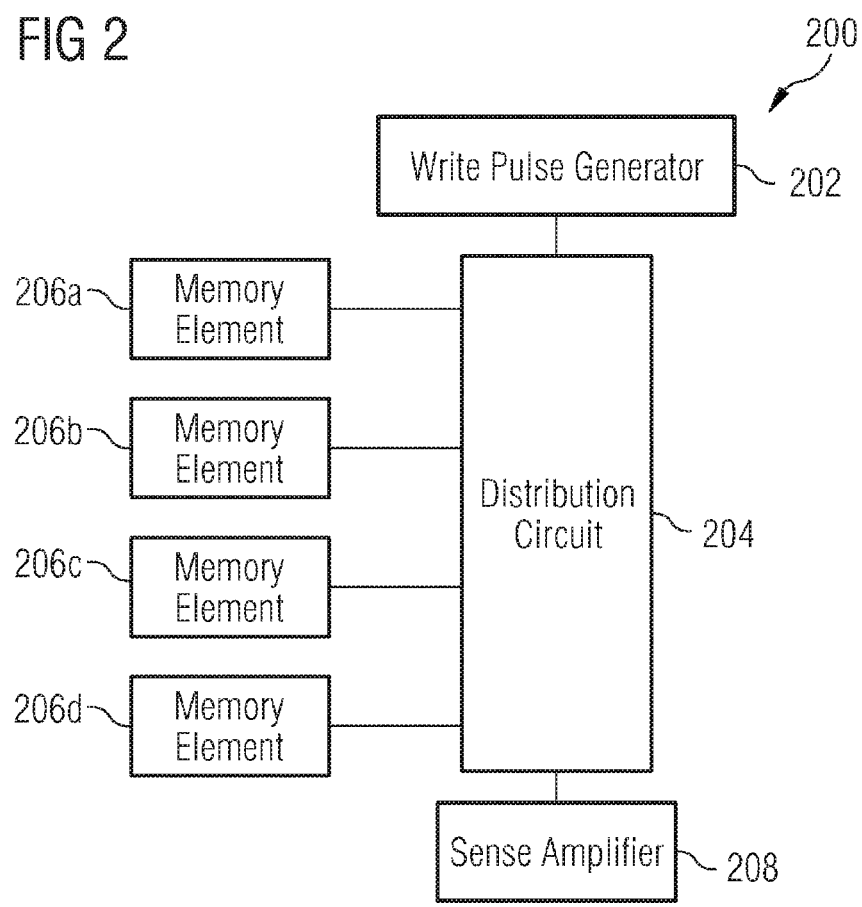
FIG. 2 shows a block diagram of a memory device using resistivity changing memory elements.

FIG. 2 illustrates a block diagram of a memory device 200 including a write pulse generator 202, a distribution circuit 204, phase changing memory elements 206 (for example phase changing memory elements 100 as shown in FIG. 1), and a sense amplifier 208. According to one embodiment, the write pulse generator 202 generates current pulses or voltage pulses that are supplied to the phase changing memory elements 206 via the distribution circuit 204, thereby programming the memory states of the phase changing memory elements 206. According to one embodiment, the distribution circuit 204 includes a plurality of transistors that supply direct current pulses or direct voltage pulses to the phase changing memory elements 206 or to heaters (not shown) disposed adjacent to the phase changing memory elements 206.

As already indicated, the phase changing material of the phase changing memory elements 206 may be changed from the amorphous state to the crystalline state (or vice versa) under the influence of a temperature change. More generally, the phase changing material may be changed from a first degree of crystallization to a second degree of crystallization (or vice versa) under the influence of a temperature change. For example, a bit value "0" may be assigned to the first (low) degree of crystallization, and a bit value "1" may be assigned to the second (high) degree of crystallization. Since different degrees of crystallization imply different electrical resistances, the sense amplifier 208 is capable of determining the memory state of one of the phase changing memory elements 206 in dependence on the resistance of the phase changing material.

To achieve high memory densities, the phase changing memory elements 206 may be capable of storing multiple bits of data, i.e. the phase changing material may be programmed to more than two resistance values. For example, if a phase changing memory element 206 is programmed to one of three possible resistance levels, 1.5 bits of data per memory element can be stored. If the phase changing memory element is programmed to one of four possible resistance levels, two bits of data per memory element can be stored, and so on.

The embodiment shown in FIG. 2 may also be applied in a similar manner to other types of resistivity changing memory elements like programmable metallization cells (PMCs), magnetoresistive memory elements (e.g. MRAMs) or organic memory elements (e.g. ORAMs).

Another type of resistivity changing memory element may be formed using carbon as a resistivity changing material. Generally, amorphous carbon that is rich is sp$^3$-hybridized carbon (i.e., tetrahedrally bonded carbon) has a high resistivity, while amorphous carbon that is rich in sp$^2$-hybridized carbon (i.e., trigonally bonded carbon) has a low resistivity. This difference in resistivity can be used in a resistivity changing memory cell.

In one embodiment, a carbon memory element may be formed in a manner similar to that described above with reference to phase changing memory elements. A temperature-induced change between an sp$^3$-rich state and an sp$^2$-rich state may be used to change the resistivity of an amorphous carbon material. These differing resistivities may be used to represent different memory states. For example, a high resistance sp$^3$-rich state can be used to represent a "0", and a low resistance sp$^2$-rich state can be used to represent a "1". It will be understood that intermediate resistance states may be used to represent multiple bits, as discussed above.

Generally, in this type of carbon memory element, application of a first temperature causes a change of high resistivity sp$^3$-rich amorphous carbon to relatively low resistivity sp$^2$-rich amorphous carbon. This conversion can be reversed by application of a second temperature, which is typically higher than the first temperature. As discussed above, these temperatures may be provided, for example, by applying a current and/or voltage pulse to the carbon material. Alternatively, the temperatures can be provided by using a resistive heater that is disposed adjacent to the carbon material.

Another way in which resistivity changes in amorphous carbon can be used to store information is by field-strength induced growth of a conductive path in an insulating amorphous carbon film. For example, applying voltage or current pulses may cause the formation of a conductive sp$^2$ filament in insulating sp$^3$-rich amorphous carbon. The operation of this type of resistive carbon memory is illustrated in FIGS. 3A and 3B.

FIG. 3A shows a carbon memory element 300 that includes a top contact 302, a carbon storage layer 304 including an insulating amorphous carbon material rich in sp$^3$ hybridized carbon atoms, and a bottom contact 306. As shown in FIG. 3B, by forcing a current (or voltage) through the carbon storage layer 304, an sp$^2$ filament 350 can be formed in the sp$^3$-rich carbon storage layer 304, changing the resistivity of the memory element. Application of a current (or voltage) pulse with higher energy (or, in some embodiments, reversed polarity) may destroy the sp$^2$ filament 350, increasing the resistance of the carbon storage layer 304. As discussed above, these changes in the resistance of the carbon storage layer 304 can be used to store information, with, for example, a high resistance state representing a "0" and a low resistance state representing a "1". Additionally, in some embodiments, intermediate degrees of filament formation or formation of multiple filaments in the sp$^3$-rich carbon film may be used to provide multiple varying resistivity levels, which may be used to represent multiple bits of information in a carbon memory element. In some embodiments, alternating layers of sp$^3$-rich carbon and sp$^2$-rich carbon may be used to enhance the formation of conductive filaments through the sp$^3$-rich layers, reducing the current and/or voltage that may be used to write a value to this type of carbon memory. Similar methods of forming a conductive path through an insulating material are used, for example, in conductive bridging (CBRAM) memory devices and in transition metal oxide (TMO) memory devices.

Another type of resistivity changing memory element is magnetoresistive random access memory, or MRAM (not shown). Generally, MRAM memory cells operate by changing a direction of magnetization of a "free" magnetic layer in relation to the direction of magnetization of a "fixed" magnetic layer, thereby changing the resistivity of the memory cell. Various conventional MRAM devices, such as thermal select MRAM devices, and spin injection MRAM devices may also be used.

Generally, numerous resistivity changing memory elements, such as are described above, may be configured as an array of memory elements, such as is shown in FIG. 4. FIG. 4 shows an illustrative portion of a memory array 400, including numerous memory cells 402 that include a resistive memory element 406, such as is described above. Each memory cell 402 is located at the intersection of a bit line 408 and a word line 410, and includes a select diode 404 and a resistive memory element 406.

Use of the select diode 404 in each memory cell 402 permits a specific memory cell to be selected for a write, reset, or read operation, without disturbing the state of other memory cells. For example, to write to the memory cell, a "WRITE" voltage, higher than a threshold (forward) voltage of the select diode 404, but lower than its breakdown (reverse) voltage is applied to the bit line 408 of the selected memory cell. This same voltage is applied to each of the word lines 410 other than the one associated with the selected cell. A lower voltage (e.g., 0 V) is applied to the word line 410 associated with the selected cell, and to each of the bit lines 408 other than the one associated with the selected cell. This results in the "WRITE" voltage (and current) being applied across the selected cell. No current flows through non-selected cells, because the potential across the other cells is lower than the breakdown voltage of the select diode 404. Similar processes can be used to select a memory cell for reset or read operations.

A memory array such as the memory array 400, in which memory cells are located at the intersections of the bit lines and word lines, may be referred to as a cross point array. It will be understood that other configurations for memory cells or memory arrays may be used. For example, in many memory devices, a select transistor is used instead of a select diode. Additionally, depending on the design of the memory cell and array, a variety of methods may be used to apply the appropriate voltages and currents for reading, writing, and resetting the state of a memory cell.

Diodes, such as the select diode 404 are used as select devices in the memory array 400, and function as a type of electrical gate or switch. An ideal diode will allow an electrical current to flow through the diode in one direction but will not allow an electrical current to flow through the diode in the opposite direction. In conventional diodes, however, a small amount of current flows in the opposite direction. This is referred to as current leakage.

Conventional diodes are typically formed from a semiconductor material, such as silicon, that is modified through a doping process. Doping is a process in which ions are implanted within the semiconductor material. There are two general types of dopants: P-type dopants and N-type dopants. P-type dopants are materials that when implanted within the semiconductor material produce regions that are referred to as "holes" that can freely accept electrons. By contrast, N-type dopants are materials that when implanted within the semiconductor material produce extra electrons. The extra electrons are not tightly bound and thus can easily travel through the semiconductor material. In general, a diode is formed when a material doped with a P-type dopant is connected to a material doped with an N-type dopant.

Figure 5:
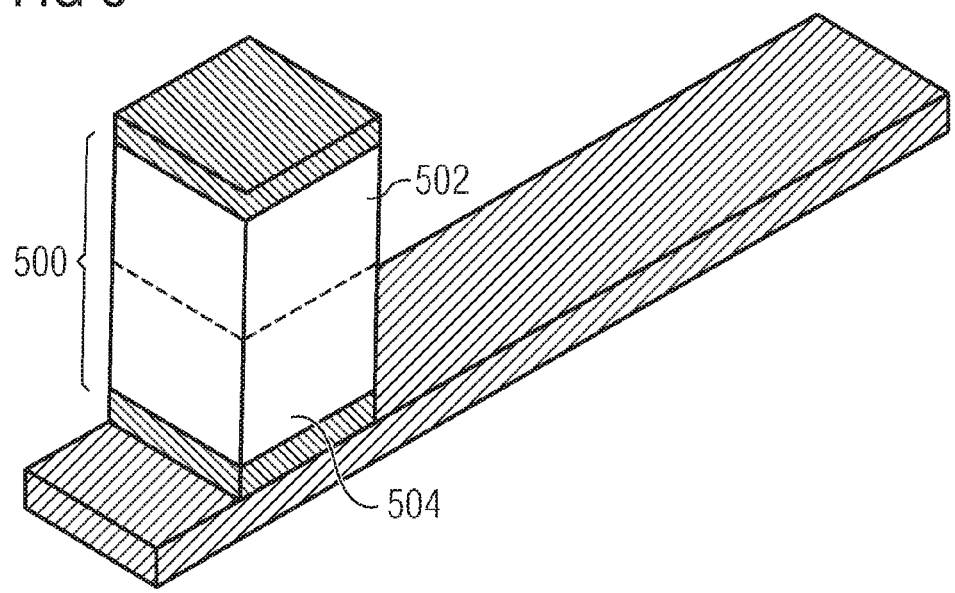
FIG. 5 shows a conventional pn vertical diode.

This is illustrated in the conventional pn vertical diode shown in FIG. 5. The diode 500 includes a p-doped region 502 in contact with an n-doped region 504.

Figure 6:
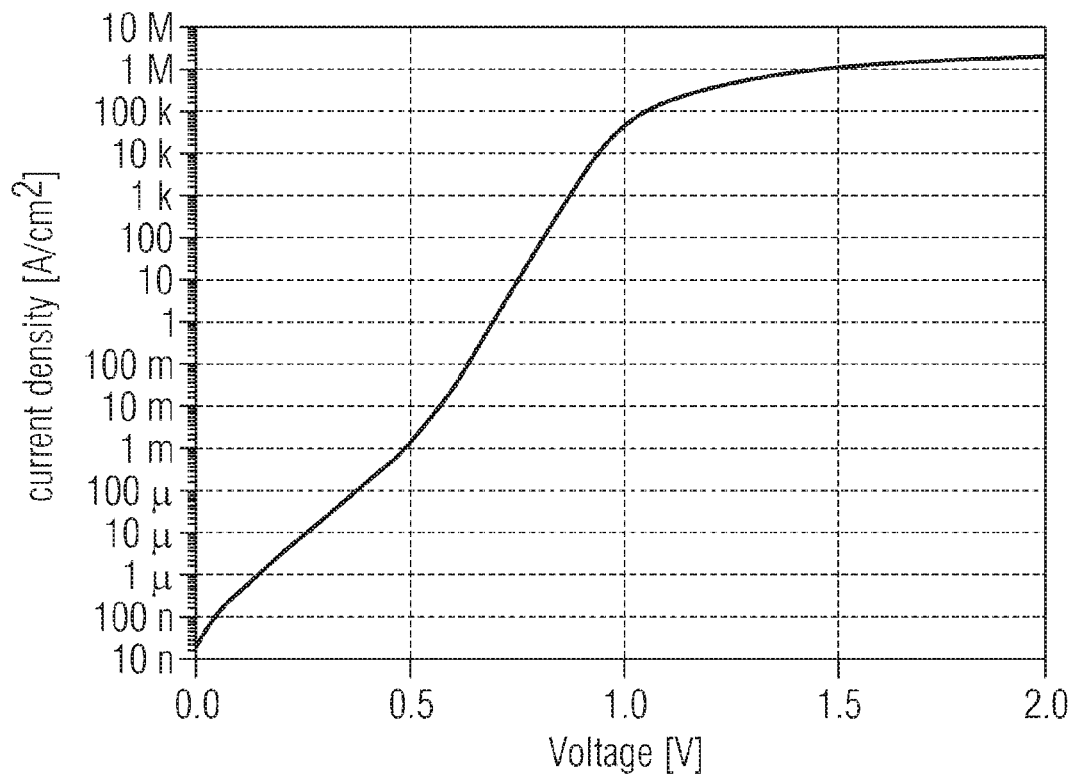
FIG. 6 is a graph showing electrical characteristics of a conventional pn diode.

Attempts have been made to increase the efficiency and current flow rate through diodes in order to speed up the microchips in which such diodes are used. In one embodiment of such a diode, one of the sides of the diode is heavily doped and the other side of the diode is lightly doped. The lightly doped side limits the current, and the heavily doped side increases the reverse bias leakage. An example of the electrical characteristics of such a pn diode with very low forward resistance is shown in FIG. 6. Generally, FIG. 6 shows the current density (in A/cm$^2$) graphed against the voltage drop across a pn diode having highly doped n- and p-regions to achieve a high current density.

Resistance-changing memories may often require current densities on the order of 1 MA/cm$^2$ for their reset currents. For instance, a single pulse of energy referred to as a "set pulse" can be used to transform a volume of phase-change material from a high resistance, amorphous phase, to a low resistance, crystalline phase. Similarly, a single pulse of energy referred to as a "reset pulse" can be used to transform the volume of phase-change material from the crystalline phase to the amorphous phase. Each phase is non-volatile (i.e., stable) and has measurable differences in its electrical characteristics, such as the change in resistance previously noted. To achieve a high area density, the current in such a memory chip for a given feature size (F) may be the same in the diode area as in the phase change memory element.

As can be seen in FIG. 6, using a conventional pn diode, a voltage drop of approximately 1.5 Volt on the diode is needed to achieve an appropriate amount of current density (1 MA/cm$^2$) through the diode. This relatively high voltage drop results in high energy consumption during switching events. Generally, the energy consumption in a switching event can be expressed as:

$E=CV^2+VIt$, where

C is the involved capacitances,
V is the voltage in use,
I is the current, and
t is the duration of the voltage pulse.

From this, it can be seen that for low energy consumption, it may be desirable to have a voltage (and voltage drop across the diode) that is relatively low. For a conventional pn diode to handle the current that is needed for switching a phase change memory element (approximately 1 MA/cm$^2$), a relatively high voltage drop across the diode is needed (approximately 1.5V), which will lead to high energy consumption. Alternatively, a very large area can be used for the diode to achieve the necessary current. However, components having a larger area may reduce the array density, and thus the number of memory cells that can be placed on a single chip.

Some attempts have been made to address these issues using Schottky diodes based on silicides to lower the serial resistance of the selected device. However, such silicide-based Schottky diodes have properties that depend strongly on the temperature history during the manufacturing processes. This causes such diodes to be difficult to manufacture in a reliable, reproducible manner. Additionally, the process of forming the silicide generally leads to formation of sharp features in the silicide structures, which in turn leads to high electric fields in the reverse-biased diode, and as a consequence, to enhanced reverse leakage and premature breakdown of the diode.

Figure 7A:
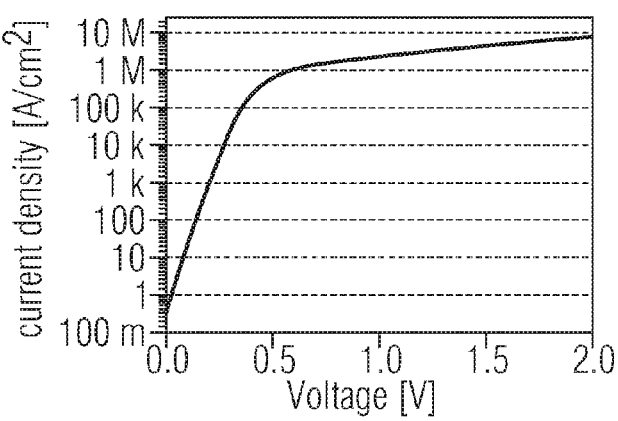
FIGS. 7A and 7B are graphs showing electrical characteristics of a carbon diode, and a comparison of the electrical characteristics of a pn diode with a carbon diode, respectively.

In accordance with an embodiment of the invention, these issues can be addressed by using carbon Schottky diodes as select devices in a memory array of resistivity-changing memory elements. A carbon Schottky diode may be formed by an interface between a doped semiconductor material, such as n-doped silicon, and a conductive carbon material, such as pyrolytic, or sp$^2$-rich carbon. Such carbon diodes have high temperature stability, no silicide formation, reproducibility and a very low mid-gap Schottky barrier. Additionally, a carbon diode can deliver considerably more current per area than conventional diodes, while maintaining a similar on/off ratio. FIG. 7A shows a graph of current density against voltage drop for a carbon diode. As can be seen, a current density of approximately 1 MA/cm$^2$ can be achieved with a voltage drop of only approximately 0.55V.

Figure 7B:
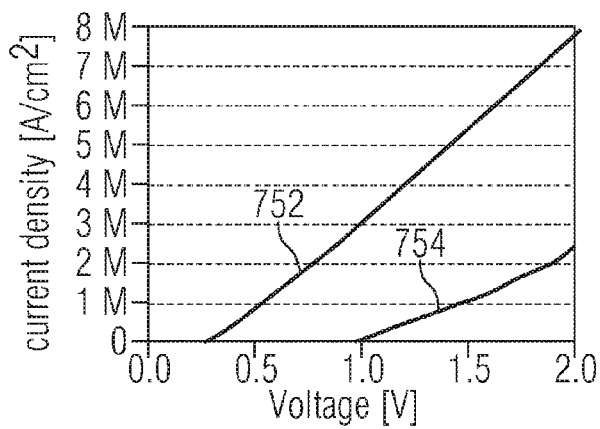

FIG. 7B shows a graph of the current density against the voltage drop for a carbon diode in curve 752, and for a conventional pn diode in curve 754. As can be seen, a carbon diode achieves approximately the same current density as the conventional pn diode at approximately ⅓ of the voltage drop of the conventional pn diode. Since the switching energy depends on the square of the voltage drop, this means that the switching energy for a memory using a carbon diode will be approximately ⅑ of the switching energy for a memory using a conventional pn diode.

Figure 8A:
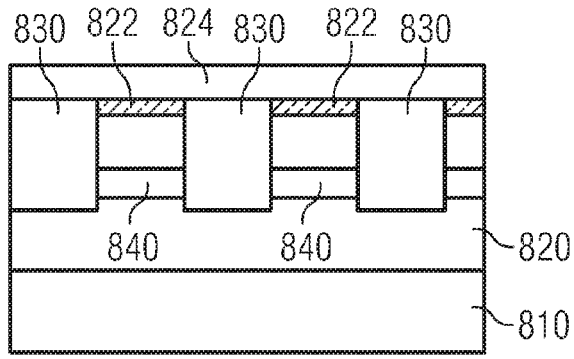

FIGS. 8A-8E illustrate the fabrication of a representative memory array in a double STI configuration, in accordance with various embodiments of the invention. As illustrated in FIG. 8A, in one embodiment, a P-type dopant such as boron is introduced in a deep portion 810 of a substrate 800. In one example, a suitable concentration of P-type dopant is on the order of above $5 \times 10^{19}$-$1 \times 10^{20}$ atoms per cubic centimeters (atoms/cm$^3$) rendering the deep portion 810 of the substrate 800 representatively P++. Overlying the deep portion 810 of the substrate 800, in this example, is an epitaxial portion 820 of P-type epitaxial silicon. In one example, the dopant concentration in the epitaxial portion 820 is on the order of about $10^{16}$-$10^{17}$ atoms/cm$^3$. The introduction and formation of the epitaxial portion 820 as P-type, and the deep portion 810 as a P++ type portion may follow conventional techniques known to those of ordinary skill in the art. FIG. 8A also illustrates the formation of a signal line material 840. The signal line material 840 may be formed, for example, by ion implantation to a preferred depth. Other embodiments that do not use structures such as the P++portion and the P epitaxial portion may be used, as is known in the art. For example, in some embodiments, a non-epitaxial wafer could be used.

The first shallow trench isolation (STI) structures 830 are formed in the epitaxial portion 820 of the substrate 800. The first STI structures 830 may be formed, for example, with the assistance of a hard mask 822 such as a silicon nitride material. A second mask 824 is depicted as protecting a region that will become a plurality of isolated diode stacks.

Figure 8B:
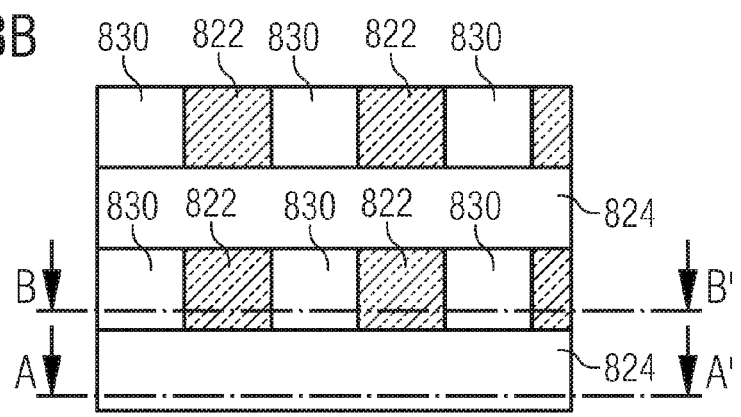

FIG. 8B is a top plan view of the substrate 800 after patterning of the second mask 824 over both the first STI structures 830 and the hard mask 822. The second mask 824 is first blanket deposited and then patterned. The second mask 824 is employed during a second etch that is orthogonal to the first STI structures 830. In a two-process etch, the second mask 824 is patterned orthogonal to the first STI structures 830 with, for example, one feature-width (1F-width) strips. It should be noted that FIG. 8A shows the elevational cross-section of the structure of FIG. 8B, taken through section line A-A'.

FIG. 8C shows an elevational cross-section view of the structure depicted in FIG. 8B, taken along the line B-B' during an etch to remove the hard mask 822. Where the hard mask 822 is a nitride such as silicon nitride, the etch may remove a portion of the first STI structures 830, which is typically an oxide. Such etch conditions are known in the art.

FIG. 8D shows an elevational cross-section view of the structure depicted in FIG. 8C after further processing. Following the removal etch of the hard mask 822, a silicon etch is carried out with the same patterning of the second mask 824. The etch method is selected to leave the oxide of the first STI structures 830. Following the patterning and silicon etching, N-type dopant may be introduced at the base of each recess to form pockets 880 having a dopant concentration on the order of about $10^{18}$-$10^{22}$ atoms/cm$^3$. This high doping concentration causes the signal line to have a reduced resistance, and may be achieved by conventional techniques, such as gas immersion laser doping (GILD).

After the silicon etch, oxide is filled into the recesses to form second shallow trench (SST) structures 832 as depicted in FIG. 8E (although in this embodiment, the structures are substantially filled quadrilateral recesses). FIG. 8E shows an elevational oblique view of selected structures of a memory device according to the invention. In this embodiment, formation of the first STI structure 830 has preceded the formation of the SST structure 832. The first STI structure 830 is substantially continuous at the upper surface. The SST structure 832 is substantially discontinuous due to the silicon etch that left the oxide material of the first STI structure 830. Thus, the SST structure 832 comprises an intermittent upper surface shallow trench isolation structure disposed in the second trench, and the first STI structure 830 comprises a continuous upper surface shallow trench isolation structure disposed in the first trench.

FIG. 8E also illustrates formation of an selection device 895 that is a portion of a diode stack. In accordance with an embodiment of the invention, selection device 895 includes a carbon Schottky diode. In one embodiment, the carbon diode may be formed of n-type silicon portion 850 that may have a dopant concentration on the order of approximately $10^{15}$-$10^{19}$ atoms/cm$^3$ and a pyrolytic or other conductive carbon portion 860. Of course, it will be appreciated that other carbon diode selection structures, such as the various embodiments described hereinbelow are similarly suitable. A memory cell structure 834 is depicted that includes the epitaxial portion 820 of P-type epitaxial silicon, signal line material 840, the n Si portion 850 and the carbon portion 860.

A memory cell feature may be defined as a minimum geometry that defines the memory cell. For example, a first feature, $F_1$ may define an edge of memory cell structure 834. A second feature, $F_2$ may define a first edge geometry of the first STI structure 830. A third feature $F_3$ may define a second edge geometry of the memory cell structure 834. Finally, a fourth feature, $F_4$ may define an edge geometry of the SST structure 832. Where the first and second features are substantially equal, they may be designated as 2F. In any event, the first through fourth features, when defined in a rectangular configuration are designated as four feature squared ($4F^2$) area 836. Beneath the selected structures it can be seen that a projection of $4F^2$ area 836 illustrates the unit cell of the memory isolation. In this embodiment, a double trench isolation structure has been achieved that acts to isolate the diode stack of memory cell structure 834 in all directions by a distance of at least 1F. In this embodiment, a reducer material has not yet been formed, and planarization has created a surface that exposes the first STI structure 830, the SST structure 832, and the carbon portion 860.

Because the memory cell structure 834 is isolated by a double trench configuration, the likelihood of cross talk between adjacent memory cell structures is reduced. Additionally, trench depths may be on the order from about 3,000 Å to about 7,000 Å and SST structure 832 may have a total depth in a range a range from about 500 Å to about 3,500 Å. Trench depths are limited by etch time constraints. Additionally, the $4F^2$ configuration is easily scalable and a simplifying portion to integrate with design rules as geometries continue to reduce.

FIGS. 9A-9H show steps in the formation of another embodiment of a memory device in accordance with the invention. These figures show a cross section taken across a cut similar to line B-B' of FIG. 8B.

In FIG. 9A, a stack 900 is shown, including a p-doped silicon substrate 902, an n++ doped silicon layer 904 and an n-doped silicon layer 906. It will be appreciated that in some embodiments, other semiconductor materials could be used. For example, instead of (or in addition to) silicon, other semiconductor materials may be used, including silicon carbide, diamond, germanium, a III-V semiconductor (e.g., BN, BP, BAs, AlN, AlP, AlAs, AlSb, GaN, GaP, GaAs, GaSb, InN, InP, InAs, InSb), a II-VI semiconductor (e.g., ZnO, ZnS, ZnSe, ZnTe, CdS, CdSe, CdTe, HgS, HgSe, HgTe, BeS, BeSe, BeTe, MgS, MgSe), or other compounds, including GeS, GeSe, GeTe, SnS, SnSe, SnTe, PbO, PbS, PbSe, PbTe, CuF, CuCI, CuBr, CuI, AgF, AgCl, AgBr, AgI, or a combination of such semiconductor materials. Additionally, it will be understood that the doping could be different. For example, p++ and p doped silicon (or other semiconductor materials) could be used, instead of n++ and n-doped silicon in the layers 904 and 906.

Above the n-doped silicon layer 906, a carbon layer 908 is deposited. The carbon layer 908 may include pyrolytic carbon or other $sp^2$-rich or conductive carbon. The carbon layer 908 may be deposited using techniques such as those described in commonly owned, co-pending U.S. patent application Ser. Nos. 11/495,808, filed Jul. 28, 2006, entitled "Method for Depositing a Conductive Carbon Material on a Semiconductor for Forming a Schottky Contact and Semiconductor Contact Device", and 11/303,639, filed Dec. 16, 2005, entitled "Methods for Elimination or Reduction of Oxide and/or Soot Deposition in Carbon Containing Layers", both of which are incorporated herein by reference in their entirety. It will be understood that other conventional techniques for depositing a conductive carbon layer may also be used to form carbon layer 908. The interface between the n doped silicon layer 906 and the carbon layer 908 forms a carbon Schottky diode 909.

Finally, a refractory metal layer 910 is deposited above the carbon layer 908. The metal layer 910 may include Ti, Ta, TiN, W, or other metals or alloys. These metals may be deposited using conventional techniques.

As shown in FIG. 9B, next, an etch process, such as is described above with reference to FIGS. 8A-8E is used to form trenches 912 for formation of a double STI structure.

After etching, a cleaning step may be carried out, optionally followed by deposition of p-doped amorphous silicon and annealing, to form a guard ring for the diode at the edge (if needed). Additionally, a radical oxidation process may be used for sidewall passivation. Next, as shown in FIG. 9C, the trenches 912 are filled with an oxide material to form STI structures 914. The top surface may then be planarized, for example using conventional chemical mechanical planarization (CMP) techniques.

With the STI structures 914, remaining portions of the n++ Doped silicon layer 904 form word lines for the memory array, and the interface between remaining portions of the n-doped silicon layer 906 and the carbon layer 908 form carbon Schottky diodes, as discussed above. In some embodiments, the remaining portions of the refractory metal layer 910 may serve to improve conductivity and reduce serial resistance.

Figure 9D:
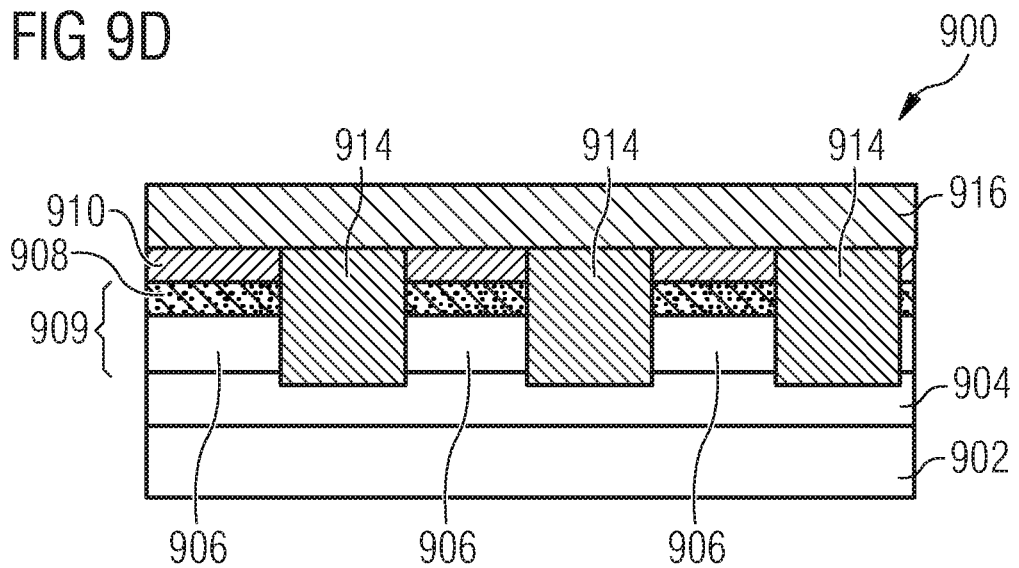

Next, as shown in FIG. 9D, an additional oxide layer 916 may be deposited. Alternatively, the additional oxide layer 916 may be deposited as an extension to the oxide deposition in the trenches 912 to form STI structures 914, as described above.

Figure 9E:
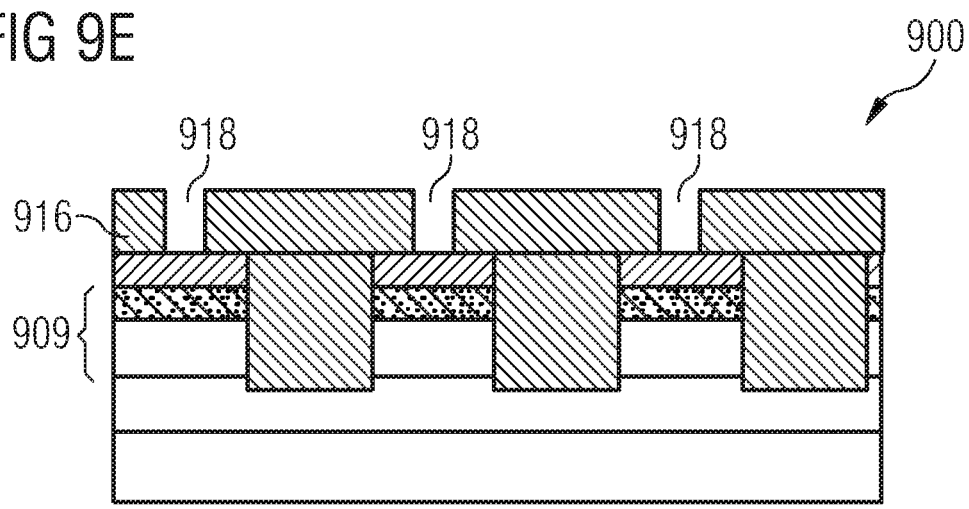
Figure 9F:
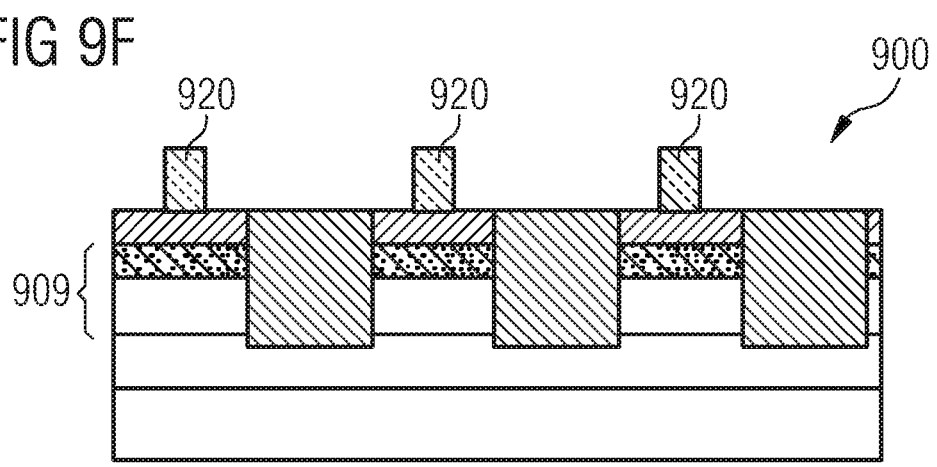

In FIG. 9E, a conventional sublithographic etching technique, such as a hardmask-spacer technique, may be used to form sublithographic holes 918 through the additional oxide layer 916. As shown in FIG. 9F, the holes 918 may then be filled with a resistivity changing material 920 (or several such materials), to form phase changing memory elements, carbon memory elements, transition metal oxide memory elements, or other resistivity changing memory elements within the holes 918. In some embodiments, the resistivity changing material may be further reduced to a sublithographic structure. As shown, in some embodiments, this may involve removal of the additional oxide layer 916. In some embodiments, the resistivity changing material is continuously deposited on the surface before the dielectric layer 916 is deposited. In this case, the resistivity changing material is structured by conventional techniques and sublithographic feature size can be obtained by resist trimming or isotropicly etching of the resistivity changing material.

In FIG. 9G, the resistivity changing material 920 is surrounded by an insulating material 922 (such as an oxide material), leaving a top surface of the resistivity changing material exposed. In some embodiments, the insulating material and resistivity changing material may be planarized, for example using conventional CMP techniques.

Next, as shown in FIG. 9H, bit lines 924 are deposited and structured. The bit lines 924 may include metals, or other conductive materials. Deposition and structuring of the bit lines 924 may be accomplished using conventional techniques, and may involve steps such as forming an additional oxide layer, lithographic etching, depositing a metal or other conductive material, and planarizing.

Figure 10B:
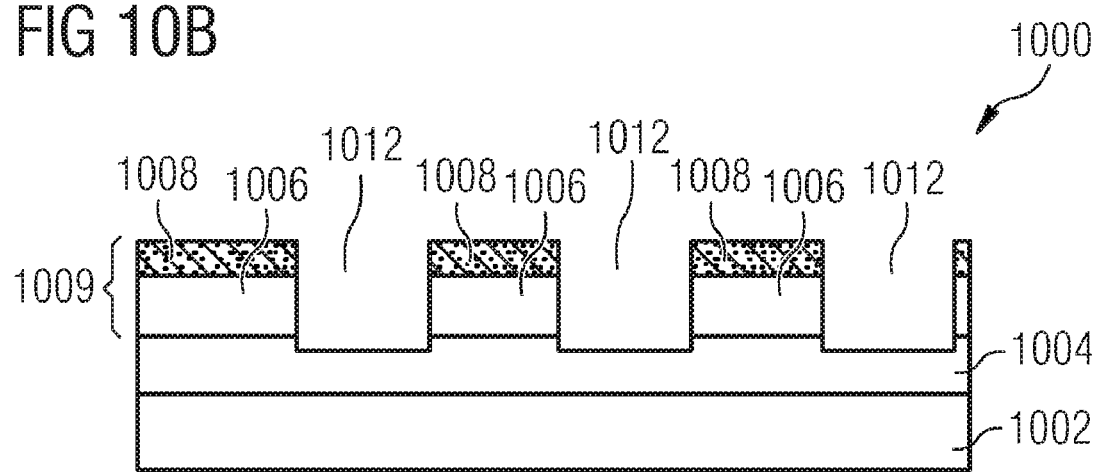

FIGS. 10A-10G are similar, showing a different embodiment of the invention, in which the metal plate above the carbon layer is absent. In FIG. 10A, a stack 1000 is shown, including a p-doped silicon substrate 1002, an n++ doped silicon layer 1004 and an n-doped silicon layer 1006. It will be appreciated that in some embodiments, other semiconductor materials, such as those described above could be used, or the doping could be different (e.g., p++ and p-doped silicon could be used, instead of n++ and n-doped silicon).

A carbon layer 1008, which may include conductive carbon such as pyrolytic carbon or other $sp^2$-rich carbon, is deposited above the n-doped silicon layer 1006. The carbon layer 1008 may be deposited using techniques such as those described above. The carbon layer 1008 in combination with the n-doped silicon layer 1006 forms a carbon Schottky diode 1009.

Figure 10C:
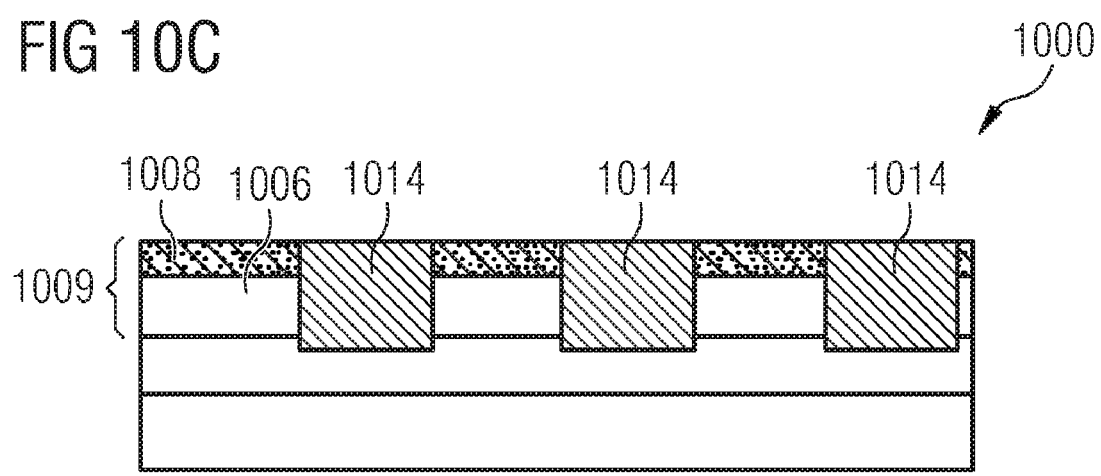

As shown in FIG. 10B, next, an etch process is used to form trenches 1012 for formation of a double STI structure. Next, as shown in FIG. 10C, the trenches 1012 are filled with an oxide material to form STI structures 1014. The top surface may then be planarized, for example using conventional chemical mechanical planarization (CMP) techniques. With the STI structures 1014, remaining portions of the n++ doped silicon layer 1004 form word lines for the memory array, and the interface between remaining portions of the n doped silicon layer 1006 and the carbon layer 1008 form carbon Schottky diodes, as discussed above.

Figure 10D:
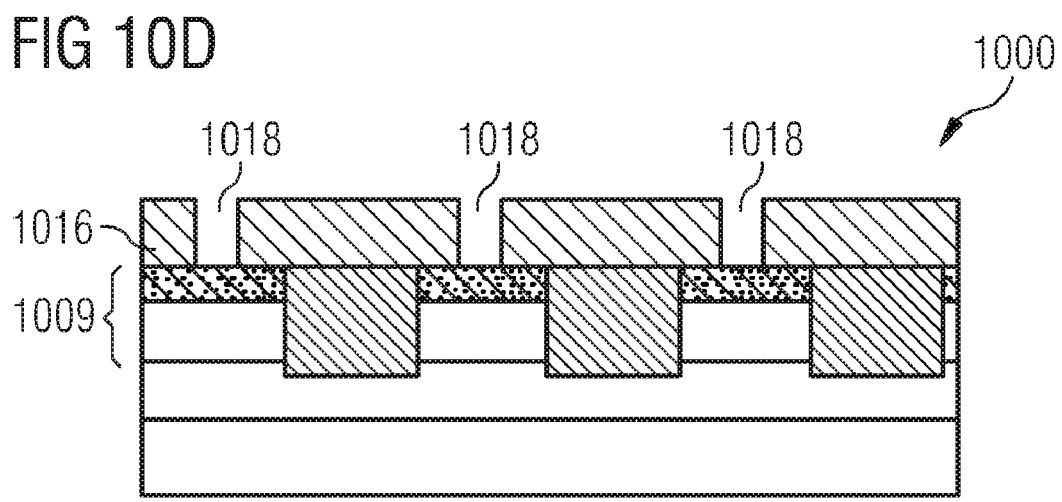

Next, as shown in FIG. 10D, an additional oxide layer 1016 may be deposited or formed as an extension to the oxide deposition in the trenches 1012. A conventional sublithographic etching technique, such as a hardmask-spacer technique, may be used to form sublithographic holes 1018 through the additional oxide layer 1016.

Figure 10E:
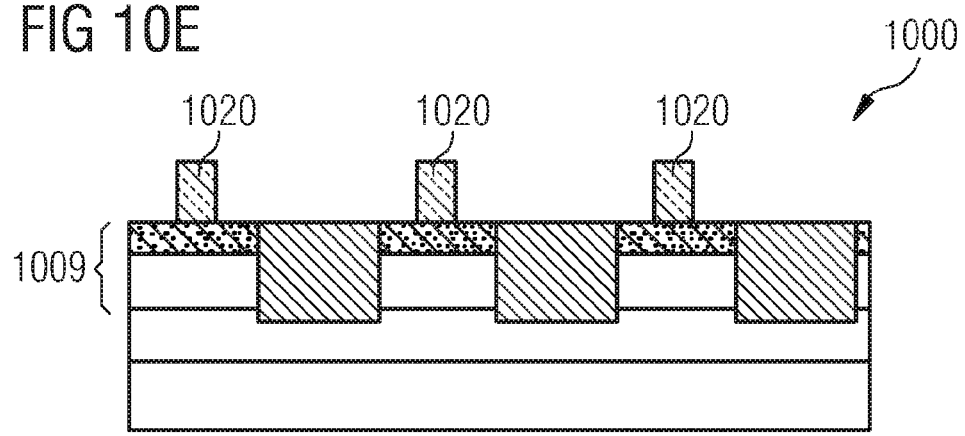

As shown in FIG. 10E, the holes 1018 may then be filled with a resistivity changing material 1020 (or several such materials), to form phase changing memory elements, carbon memory elements, transition metal oxide memory elements, or other resistivity changing memory elements within the holes 1018. In some embodiments, the resistivity changing material 1020 may be further reduced to a sublithographic structure. As shown, in some embodiments, this may involve structuring of the resistivity changing material before the additional oxide (dielectric) layer 1016 is deposited.

Figure 10F:
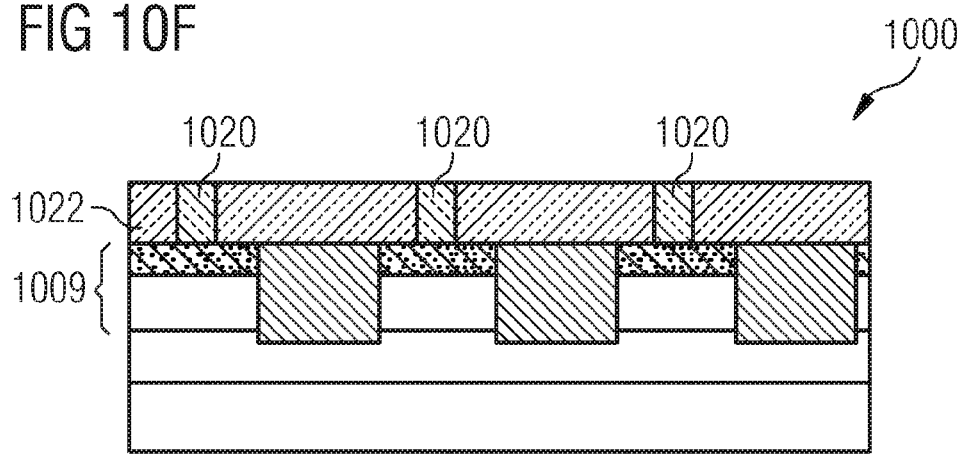

In FIG. 10F, the resistivity changing material 1020 is surrounded by an insulating material 1022 (such as an oxide material), leaving a top surface of the resistivity changing material exposed. In some embodiments, the insulating material and resistivity changing material may be planarized, for example using conventional CMP techniques.

Figure 10G:
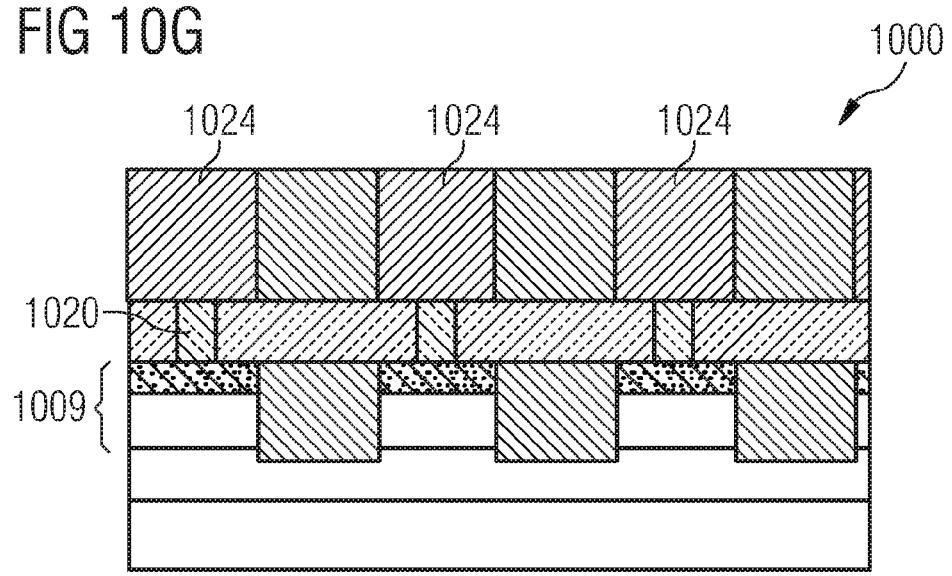

Next, as shown in FIG. 10G, bit lines 1024 are deposited and structured. The bit lines 1024 may include metals, or other conductive materials. Deposition and structuring of the bit lines 1024 may be accomplished using conventional techniques.

Figure 11A:
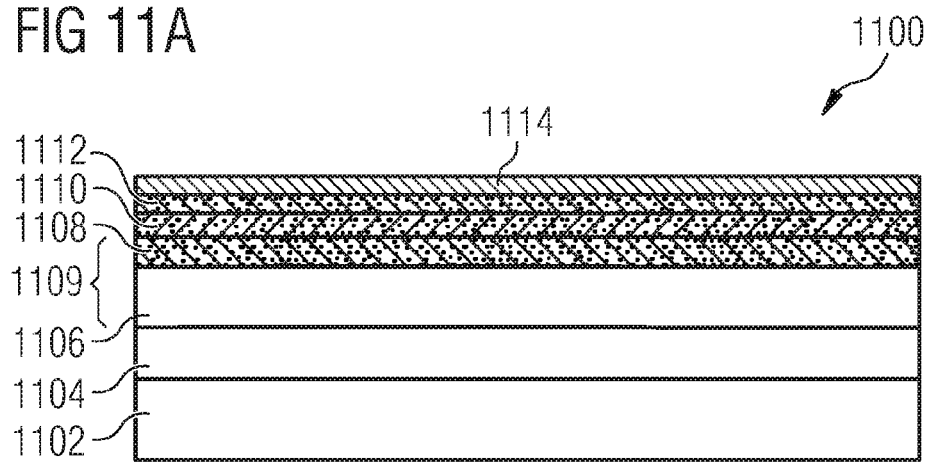

FIGS. 11A-11D show another embodiment in which a carbon resistivity changing memory element is used with the carbon diode. In FIG. 11A, a stack 1100 is shown that includes a p-doped substrate 1102, an n++ doped silicon layer 1104, an n-doped silicon layer 1106, a first conductive carbon layer 1108, and insulating carbon layer 1110, a second conductive carbon layer 1112, and a metal layer 1114. The n-doped silicon layer 1106 and the first conductive carbon layer 1108 form a carbon Schottky diode 1109 at their interface. As above, it will be understood that different semiconductor materials and doping may be used.

The first and second conductive carbon layers 1108 and 1112 may include conductive carbon materials, such as pyrolytic carbon, or other $sp^2$-rich carbon materials. The insulating carbon layer 1110 may include an $sp^3$-rich carbon material. These three layers will be used to form carbon memory elements that operate in a manner as described above, with reference to FIGS. 3A and 3B. The n doped silicon layer 1106 and the first conductive carbon layer 1108 will be used to form carbon Schottky diodes 1109.

Figure 11B:
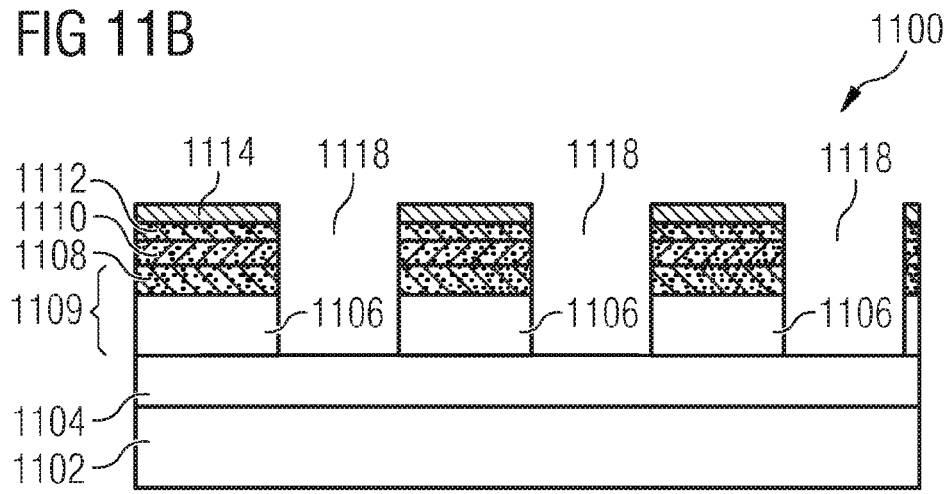

As shown in FIG. 11B, trenches 1118 may be etched, to structure the memory cells. In some embodiments, sidewall passivation may occur after the trenches 1118 are etched. The etching and passivation may be accomplished using conventional techniques. For example, this may include the deposition of a thin Si layer and the subsequent oxidation of this layer.

Figure 11C:
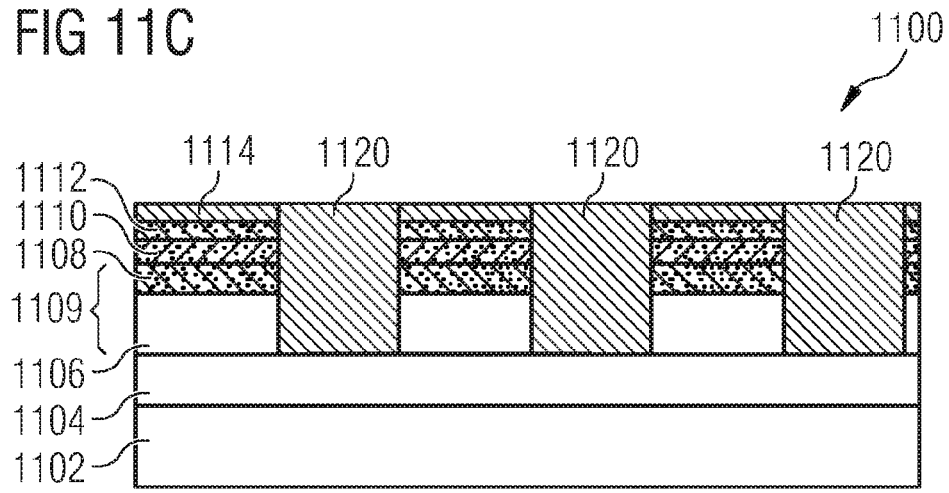

In FIG. 11C, the trenches 1118 have been filled with an oxide material 1120. The top surface may then be back-polished/planarized using conventional CMP techniques.

Finally, as shown in FIG. 11D, additional oxide material 1122 is deposited, forming an additional inter metal dielectric, and bit lines 1124 are formed. The bit lines 1124 may include metals, such as Al or Cu, or other conductive materials. The first and second conductive carbon layers 1108 and 1112 and the insulating carbon layer 1110 form a carbon memory element 1126, and the n-doped silicon layer 1106 and the first conductive carbon layer 1108 form a carbon Schottky diode 1109.

Figure 12C:
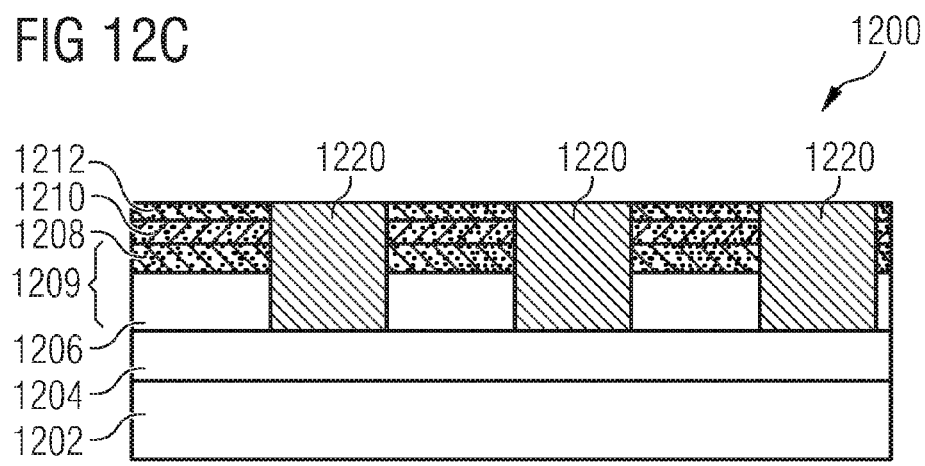

FIGS. 12A-12D show the formation of another embodiment, in which a carbon memory us used without an additional metal plate. In FIG. 12A, a stack 1200 is shown that includes a p-doped substrate 1202, an n++ doped silicon layer 1204, an n-doped silicon layer 1206, a first conductive carbon layer 1208, and insulating carbon layer 1210, and a second conductive carbon layer 1212. The n-doped silicon layer 1206 and first conductive carbon layer 1208 form a carbon Schottky diode 1209. As in other embodiments, it will be understood that different semiconductor materials and doping may be used.

The first and second conductive carbon layers 1208 and 1212 may include conductive carbon materials, such as pyrolytic carbon, or other $sp^2$-rich carbon materials. The insulating carbon layer 1210 may include an $sp^3$-rich carbon material. These three layers are used to form carbon memory elements that operate in a manner as described above, with reference to FIGS. 3A and 3B. The n doped silicon layer 1206 and the first conductive carbon layer 1208 are used to form carbon Schottky diodes 1209.

As shown in FIG. 12B, trenches 1218 may be etched, to structure the memory cells. In some embodiments, sidewall passivation may occur after the trenches 1218 are etched. The etching and passivation may be accomplished using conventional techniques.

In FIG. 12C, the trenches 1218 have been filled with an oxide material 1220. The top surface may then be back-polished/planarized using conventional CMP techniques.

Figure 12D:
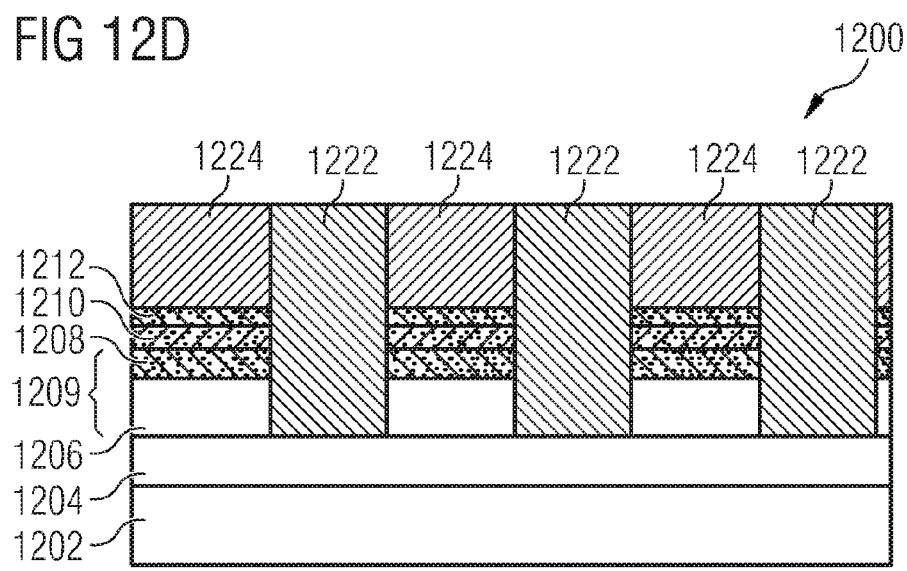

Finally, as shown in FIG. 12D, additional oxide material 1222 is deposited, forming an additional inter metal dielectric, and bit lines 1224 are formed. The bit lines 1224 may include metals, such as Al or Cu, or other conductive materials. The first and second conductive carbon layers 1208 and 1212 and the insulating carbon layer 1210 form a carbon memory element 1226. The n doped silicon layer 1206 and the first conductive carbon layer 1208 form a carbon Schottky diode 1228.

Figure 13A:
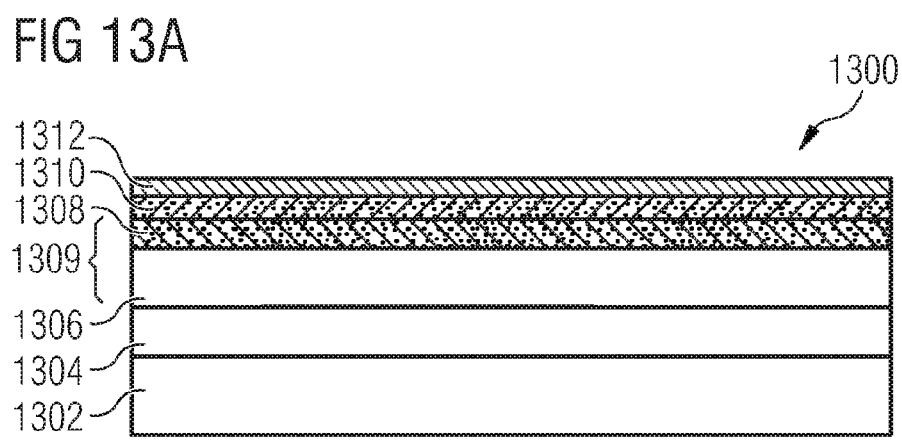
FIGS. 13A and 13B show another embodiment, in which a carbon memory having a direct metal plate is formed.

FIGS. 13 A and B show another embodiment, in which a carbon memory having a direct metal plate is formed. In FIG. 13A, a stack 1300 is shown that includes a p-doped substrate 1302, an n++ doped silicon layer 1304, an n-doped silicon layer 1306, a conductive carbon layer 1308, an insulating carbon layer 1310, and a refractory metal layer 1312. The conductive carbon layer 1308 may include conductive carbon materials, such as pyrolytic carbon, or other $sp^2$-rich carbon materials. The insulating carbon layer 1310 may include an $sp^3$-rich carbon material. The refractory metal layer 1312 may contain a metal or other conductive material. These three layers are used to form carbon memory elements that operate in a manner as described above, with reference to FIGS. 3A and 3B. The n-doped silicon layer 1306 and the conductive carbon layer 1308 are used to form a carbon Schottky diode 1309.

Figure 13B:
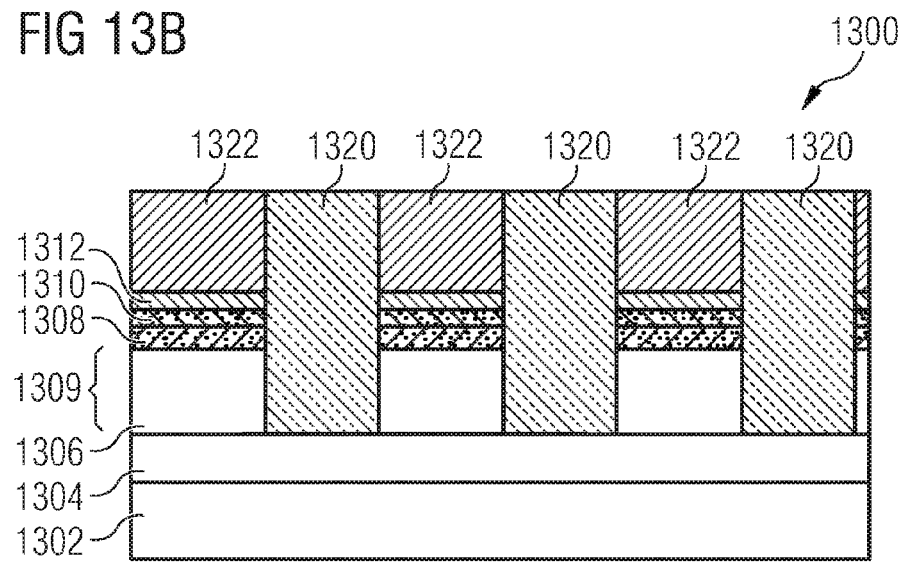

FIG. 13B shows the device, including isolation structures 1320, which may be filled with an oxide material, and bit lines 1322. The bit lines 1322 may include a metal or other conductive material. The isolation structures 1320 and bit lines 1322 may be formed using techniques such as those described hereinabove.

Figure 14A:
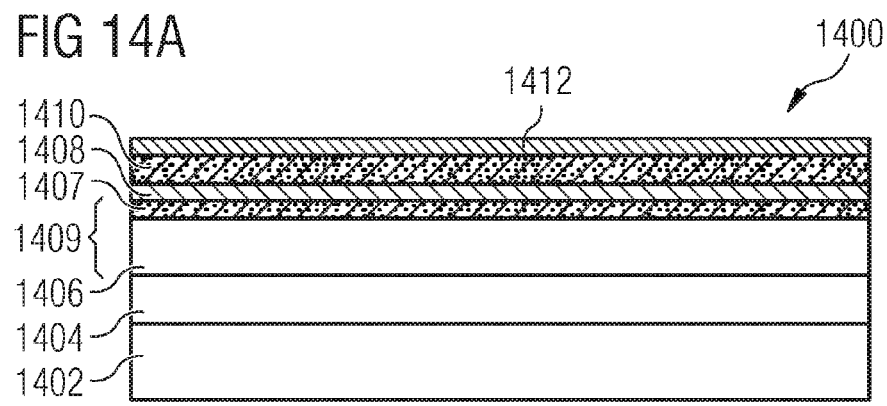
FIGS. 14A and 14B show another embodiment, having a metal-carbon-metal (MCM) stack as a carbon memory element.

FIGS. 14 A and B show another embodiment, having a metal-carbon-metal (MCM) stack as a carbon memory element. In FIG. 14A, a stack 1400 is shown that includes a p-doped substrate 1402, an n++ doped silicon layer 1404, an n-doped silicon layer 1406, a conductive carbon layer 1407, a first refractory metal layer 1408, an insulating carbon layer 1410, and a second refractory metal layer 1412. The conductive carbon layer 1407 may include conductive carbon materials, such as pyrolytic carbon or other $sp^2$-rich carbon materials. The first and second refractory metal layers 1408 and 1412 may contain a metal or other conductive materials. The insulating carbon layer 1410 may include an $sp^3$-rich carbon material. These three layers are used to form carbon memory elements that operate in a manner as described above, with reference to FIGS. 3A and 3B. The n-doped silicon layer 1406 and the conductive carbon layer 1407 are used to form a carbon Schottky diode 1409.

Figure 14B:
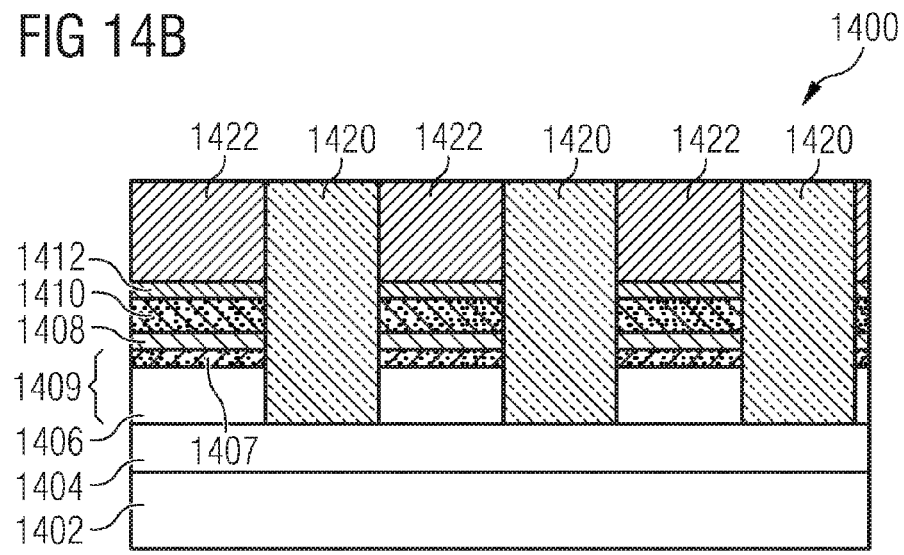

FIG. 14B shows the device, including isolation structures 1420, which may be filled with an oxide material, and bit lines 1422. The bit lines 1422 may include a metal or other conductive material. The isolation structures 1420 and bit lines 1422 may be formed using techniques such as those described hereinabove.

Figure 15A:
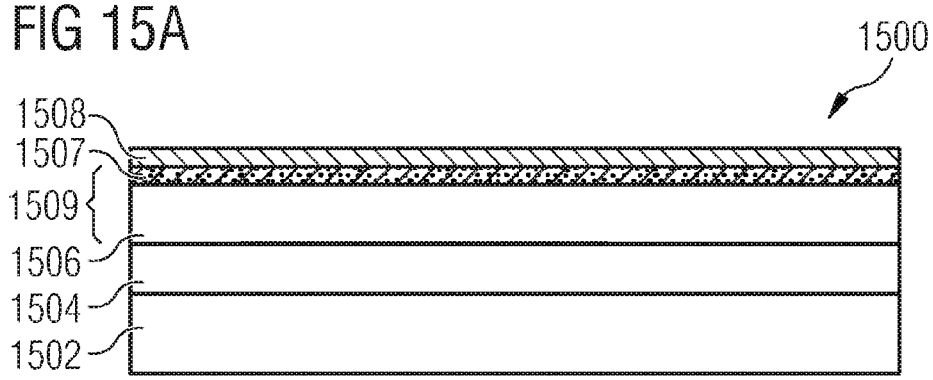
FIGS. 15A-15C show a carbon memory dual damascene embodiment.
Figure 15B:
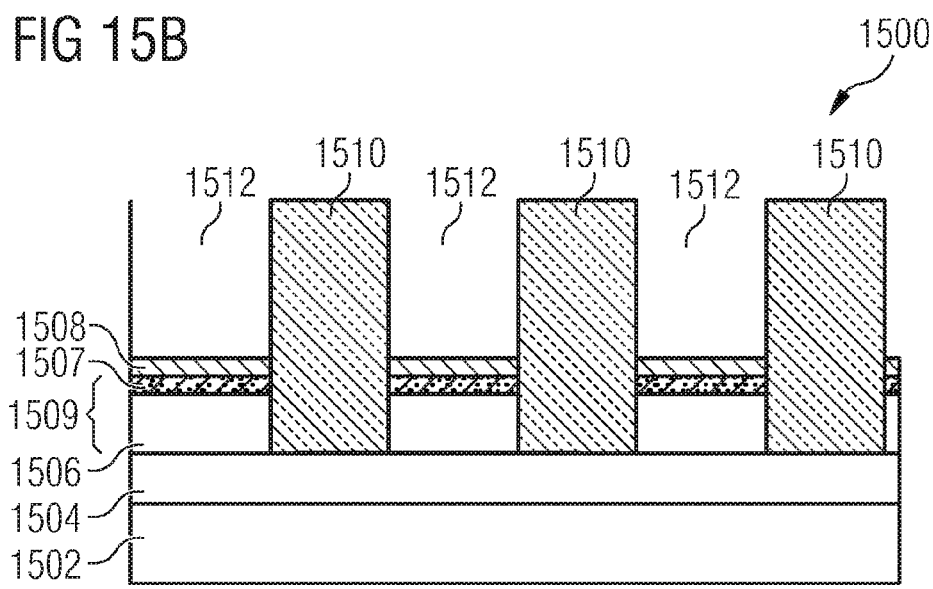
Figure 15C:
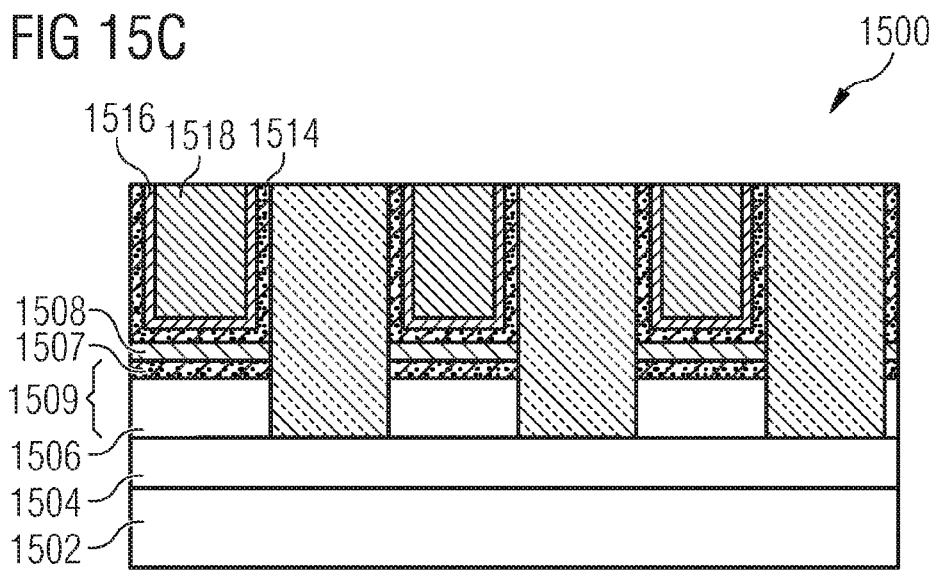

FIGS. 15A-15C show a carbon memory dual damascene embodiment. In FIG. 15A, a stack 1500 is shown that includes a p-doped substrate 1502, an n++ doped silicon layer 1504, an n-doped silicon layer 1506, a conductive carbon layer 1507, and a first refractory metal layer 1508. The conductive carbon layer 1507 may include conductive carbon materials, such as pyrolytic carbon or other $sp^2$-rich carbon materials. The first refractory metal layer 1508 may contain a metal or other conductive materials. The n-doped silicon layer 1506 and the conductive carbon layer 1507 are used to form a carbon Schottky diode 1509.

In FIG. 15B, isolation structures 1510 have been formed, with trenches 1512 formed between the isolation structures 1510. The isolation structures 1510 may include an oxide material. The isolation structures 1510 and trenches 1512 may be formed using conventional deposition and structuring techniques, similar to those discussed above.

In FIG. 15C, the trenches 1512 have been filled according to a dual damascene process to complete the memory cells. First, a layer of insulating carbon 1514 was formed lining the trenches. The layer of insulating carbon 1514 may include an $sp^3$-rich carbon material, which is used to form a carbon memory such as is described above, with reference to FIGS. 3A and 3B.

A second refractory metal layer 1516 may be formed to line the trenches over the layer of insulating carbon, and the remainder of the trench may be filled with a metal, such as Cu, Al, or another conductive material, to form bit lines 1518. The resulting structure may then be planarized using conventional planarization techniques, such as CMP. A carbon Schottky diode 1509 is formed from the boundary between the n doped silicon layer 1506 and the conductive carbon layer 1507.

Figure 16A:
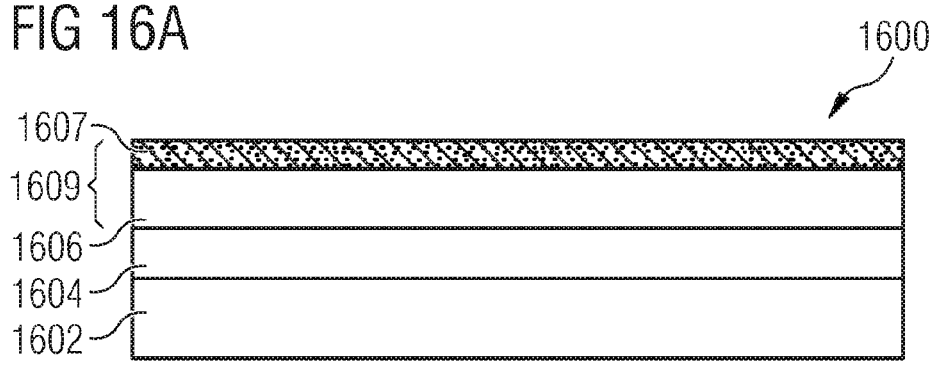
FIGS. 16A-16C show a second dual damascene embodiment, with direct contact between the conductive carbon and insulating carbon layers.

FIGS. 16 A-16C show a second dual damascene embodiment, with direct contact between the conductive carbon and insulating carbon layers. In FIG. 16A, a stack 1600 is shown that includes a p-doped substrate 1602, an n++ doped silicon layer 1604, an n-doped silicon layer 1606, and a conductive carbon layer 1607. The conductive carbon layer 1607 may include conductive carbon materials, such as pyrolytic carbon or other $sp^2$-rich carbon materials. The n-doped silicon layer 1606 and the conductive carbon layer 1607 are used to form a carbon Schottky diode 1609.

Figure 16B:
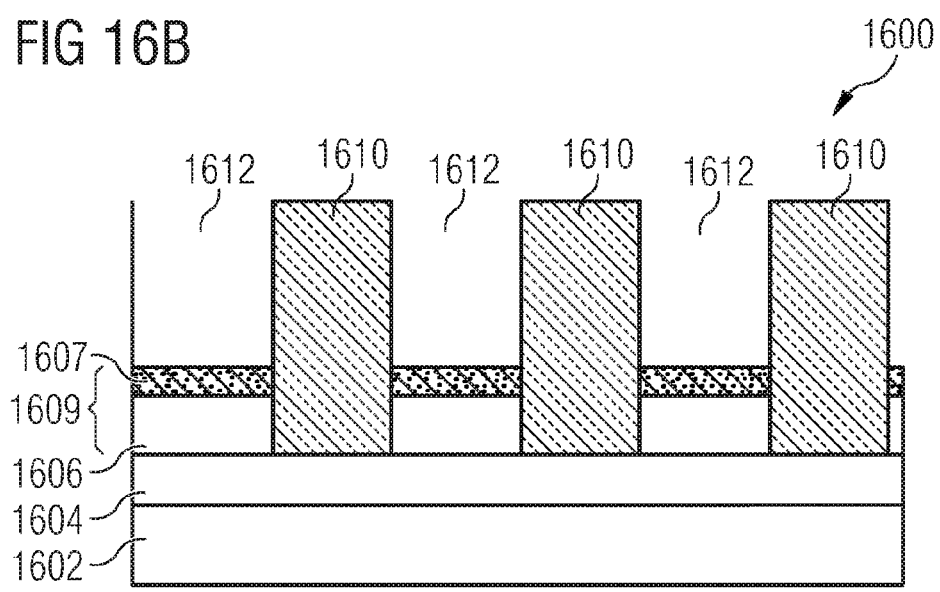

In FIG. 16B, isolation structures 1610 have been formed, with trenches 1612 formed between the isolation structures 1610. The isolation structures 1610 may include an oxide material. The isolation structures 1610 and trenches 1612 may be formed using conventional deposition and structuring techniques, similar to those discussed above.

Figure 16C:
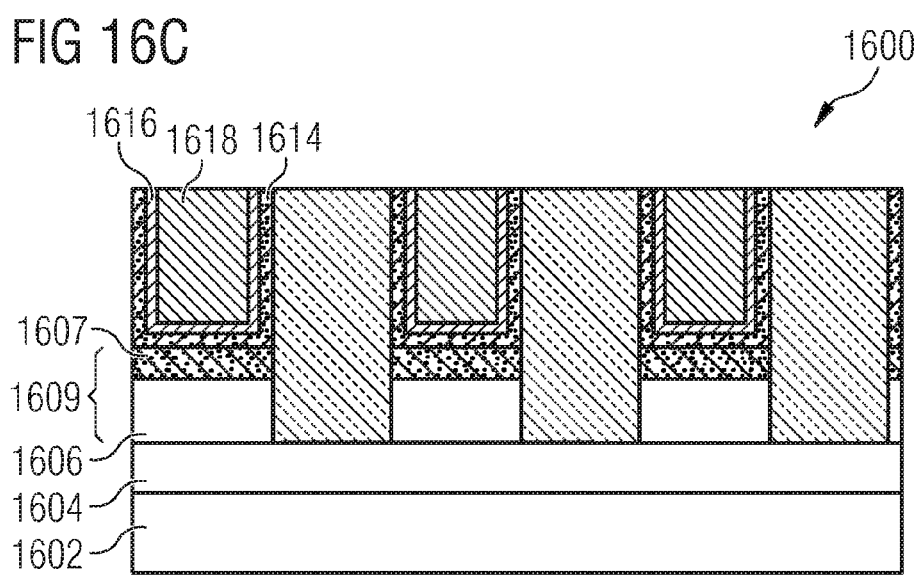

In FIG. 16C, the trenches 1612 have been filled according to a dual damascene process to complete the memory cells. First, a layer of insulating carbon 1614 was formed lining the trenches. The layer of insulating carbon 1614 may include an $sp^3$-rich carbon material, which is used to form a carbon memory such as is described above, with reference to FIGS. 3A and 3B.

A refractory metal layer 1616 may be formed to line the trenches over the layer of insulating carbon, and the remainder of the trench may be filled with a metal, such as Cu, Al, or another conductive material, to form bit lines 1618. The resulting structure may then be planarized using conventional planarization techniques, such as CMP. A carbon Schottky diode 1609 is formed from the boundary between the n-doped silicon layer 1606 and the conductive carbon layer 1607.

Figure 17A:
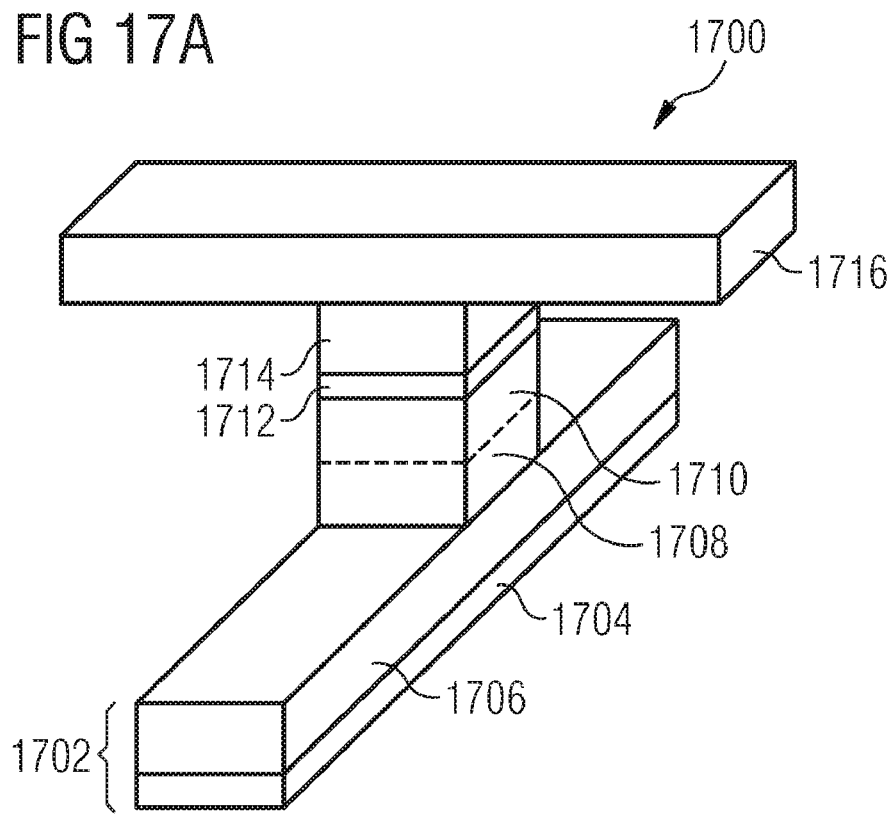
FIGS. 17A and 17B show two examples of a memory cell formed on an isolating surface, in accordance with embodiments of the invention.
Figure 17B:
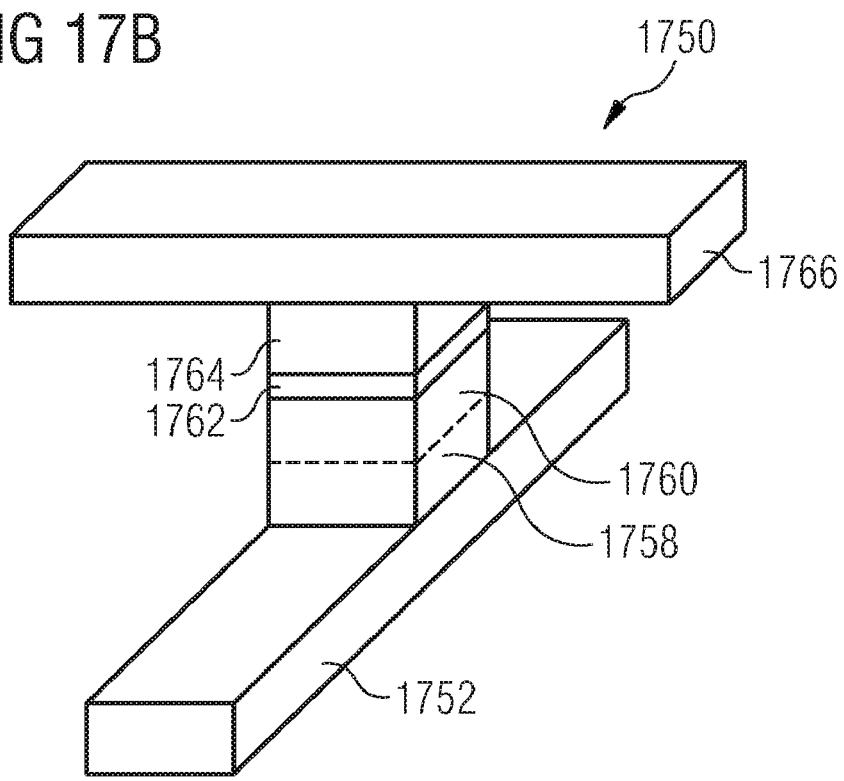

In accordance with some embodiments of the invention, a memory cell including a carbon diode and a resistive memory element may be formed not just on epitaxial Si (as shown above), but on any isolating surface. FIGS. 17A and 17B show two example embodiments of such a memory cell.

In FIG. 17A, a memory cell 1700 includes a word line 1702 that includes a conductive carbon layer 1706, formed over a refractory metal layer 1704 that supports the conductivity of the word line 1702. A doped semiconductor layer 1708, in contact with the conductive carbon layer 1706 forms a carbon Schottky diode. The doped semiconductor layer 1708 may be n– or p– doped, and may be formed of Si, or of other semiconductor materials, as described above. A highly doped (n++ or p++) semiconductor layer 1710 is formed above the doped semiconductor layer 1708. Above the highly doped semiconductor layer 1710, a contact layer 1712 is formed. The contact layer 1712 may include a conductive carbon material, or a refractory silicide forming metal layer.

Next, the memory cell 1700 includes a resistivity changing memory element 1714. The resistivity changing memory element 1714 may be, for example, any of the types of resistivity changing memory elements described above, such as a phase changing memory, a carbon memory, a conductive bridging memory, a TMO memory, an MRAM, or another type of resistivity changing memory.

A bit line 1716 is formed in electrical contact with the resistivity changing memory element 1714. The bit line 1716 may include a metal or other conductive material.

FIG. 17B shows a memory cell 1750 that is similar to the memory cell 1700 of FIG. 17A, but which does not include an extra refractory metal layer as part of the word line. Thus, the memory cell 1750 includes a word line 1752 formed of a conductive carbon material. A doped semiconductor layer 1758 (n– or p– doped), in contact with the conductive carbon word line 1752 forms a carbon Schottky diode. A highly doped (n++ or p++) semiconductor layer 1760 is formed above the doped semiconductor layer 1758. Above the highly doped semiconductor layer 1760, a contact layer 1762 is formed, which may include a conductive carbon material, or a refractory silicide forming metal layer. Next, the memory cell 1750 includes a resistivity changing memory element 1764, and a bit line 1766.

Figure 18:
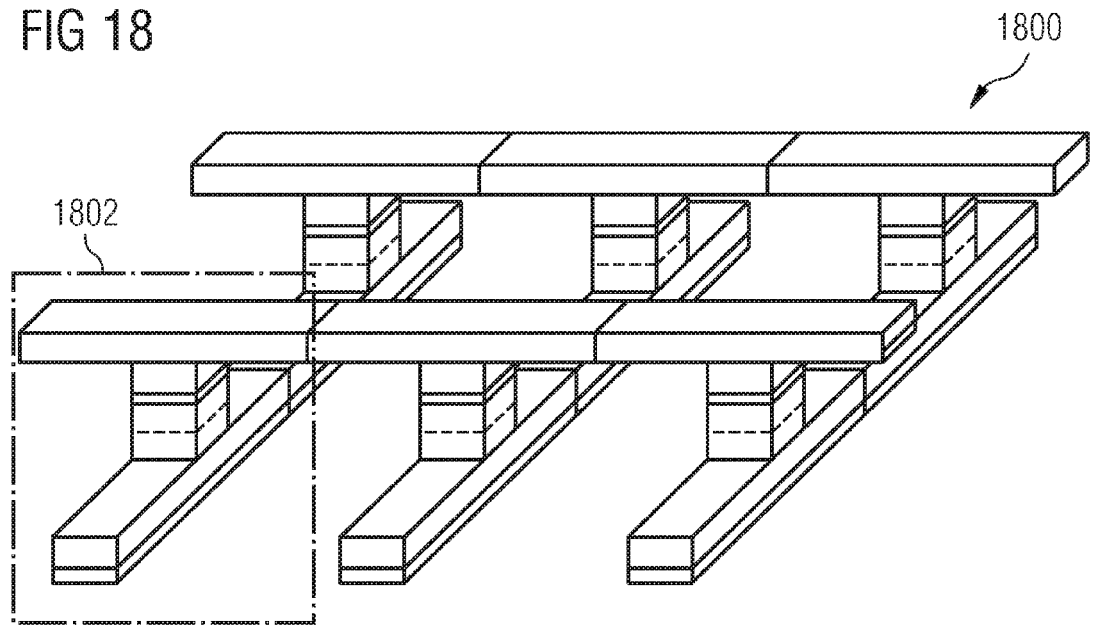
FIG. 18 shows the structure of a memory array in accordance with an embodiment of the invention.

FIG. 18 shows the structure of an array 1800 of memory cells 1802 that may be formed in an integrated circuit. The memory cells 1802 are similar in structure to those shown in FIGS. 17A and 17B.

Figure 19A:
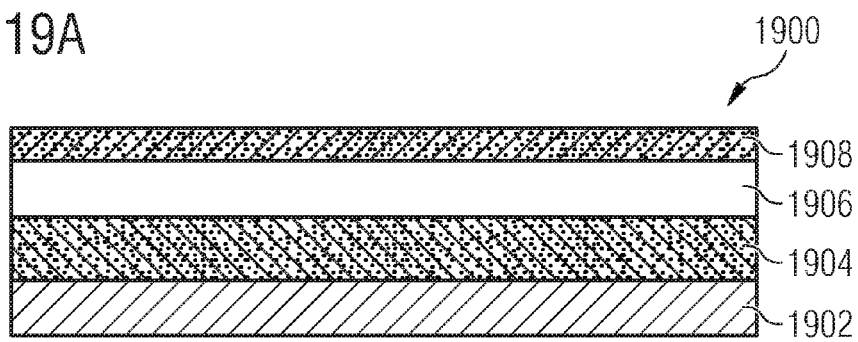
FIGS. 19A-19F show steps in a process for forming an integrated circuit memory device in accordance with an embodiment of the invention.

FIGS. 19A-19F show steps in a process for forming an integrated circuit including memory cells of the type shown in FIGS. 17A and 17B. In FIG. 19A a stack 1900 is formed on a substrate 1902, which may be isolating. A conductive carbon layer 1904, which may include pyrolytic carbon or other $sp^2$-rich carbon, is formed to a thickness ranging from approximately 1 nm to approximately 1000 nm. Next, a semiconductor layer 1906, which may include poly-Si, amorphous Si, or other semiconductor materials, is formed to a thickness of approximately 10 to approximately 500 nm. A second conductive carbon layer 1908 may be formed above the semiconductor layer 1906. The various layers of the stack 1900 may be formed using conventional techniques, such as are described above.

Figure 19B:
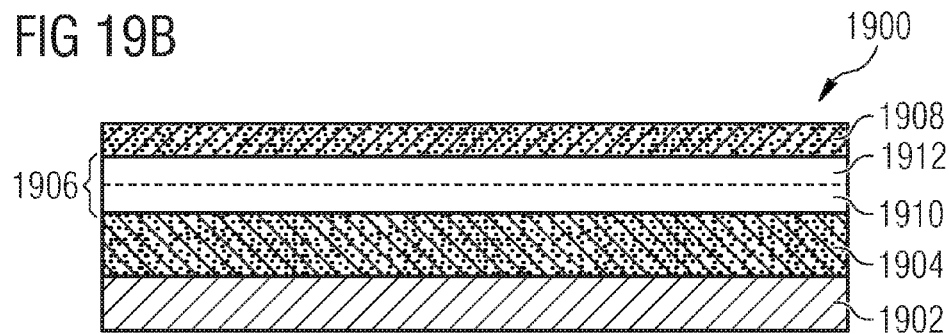

As shown in FIG. 19B, the semiconductor layer 1906 is doped to form two sub-layers; a low doped sub-layer 1910 as a bottom contact, and a highly doped sup-layer 1912 as a top contact. The low doped sub-layer 1910, which may be n– or p– doped, may have a doping concentration of approximately $10^{15}$ to approximately $10^{18}$. The highly doped sub-layer 1912, which may be n++ or p++ doped, may have a doping concentration of approximately $10^{18}$ to approximately $10^{21}$. Doping the semiconductor layer 1906 may be achieved by conventional techniques, such as ion implantation. The interface between the low doped sub-layer 1910 and the conductive carbon layer 1904 forms a carbon diode, as discussed above.

Figure 19C:
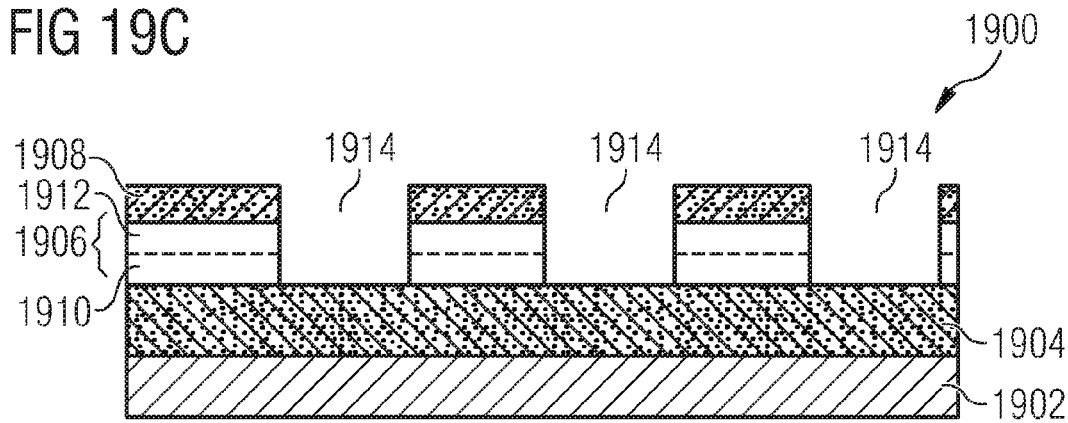

As shown in FIG. 19C, the stack 1900 is structured by forming trenches 1914. Such trenches may be formed in two parallel directions (not shown in this view) to obtain the isolated word lines and the semiconductor piles including the semiconductor layer 1906 and second conductive carbon layer 1908. This structuring may be achieved using conventional techniques, such as a hard mask etch technique.

Additionally, rapid thermal processing (RTP), an ultra-short laser anneal, or other annealing technique may be applied to convert the semiconductor material in the semiconductor layer 1906, such as poly-Si, into a single semiconductor crystal (such as single-crystal Si), and to activate the doping. In some embodiments, a guard ring can be incorporated by doping the outer surface of the semiconductor pillars (i.e., the structures formed from the semiconductor layer 1906) with the opposite doping material.

Figure 19D:
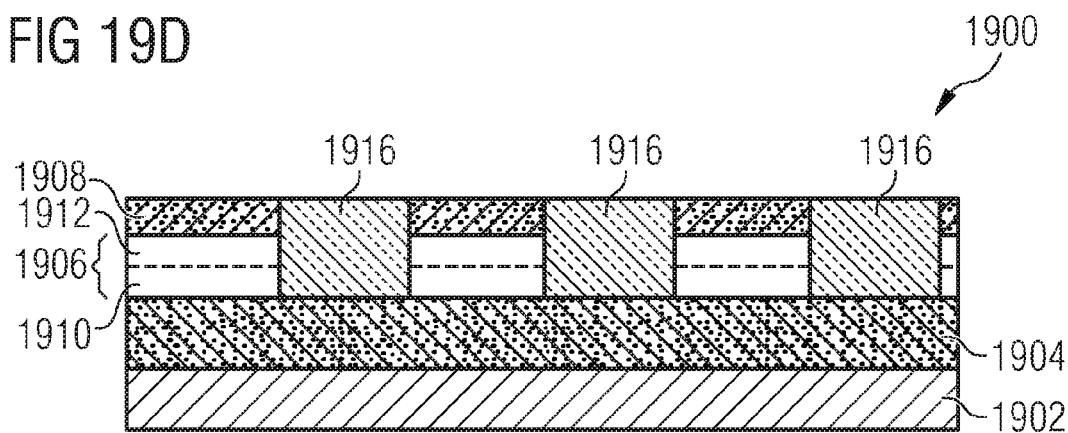

As shown in FIG. 19D, the structure may then be filled with an insulating material 1916, such as an oxide, and planarized. The planarization may be achieved using conventional techniques, such as CMP.

Figure 19E:
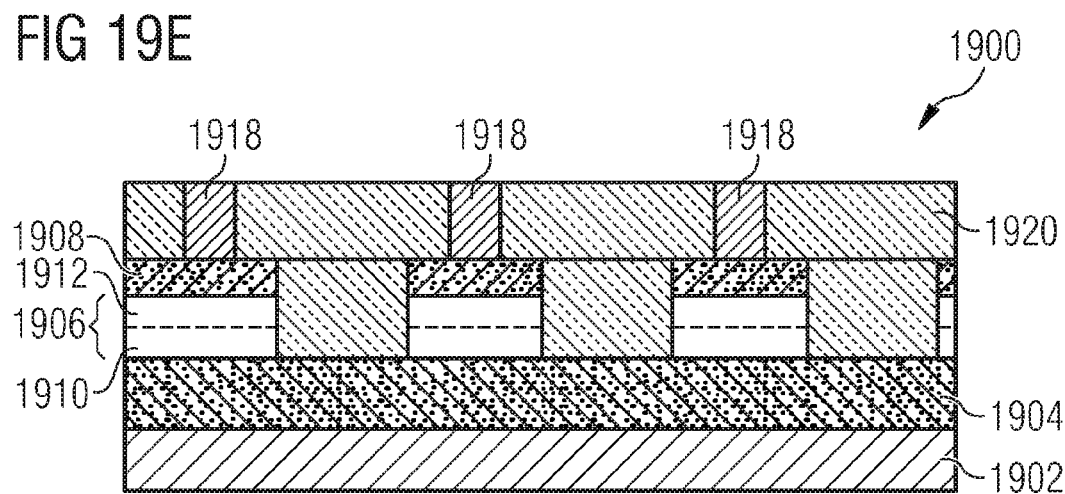

As shown in FIG. 19E, a resistivity changing memory element 1918, which may include a resistance changeable material, is formed in contact with the second conductive carbon layer 1908. In some embodiments, the resistivity changing memory element 1918 may be formed in a sub-lithographic structure. The resistivity changing memory element 1918 may be surrounded by an insulating material 1920, such as an oxide.

Figure 19F:
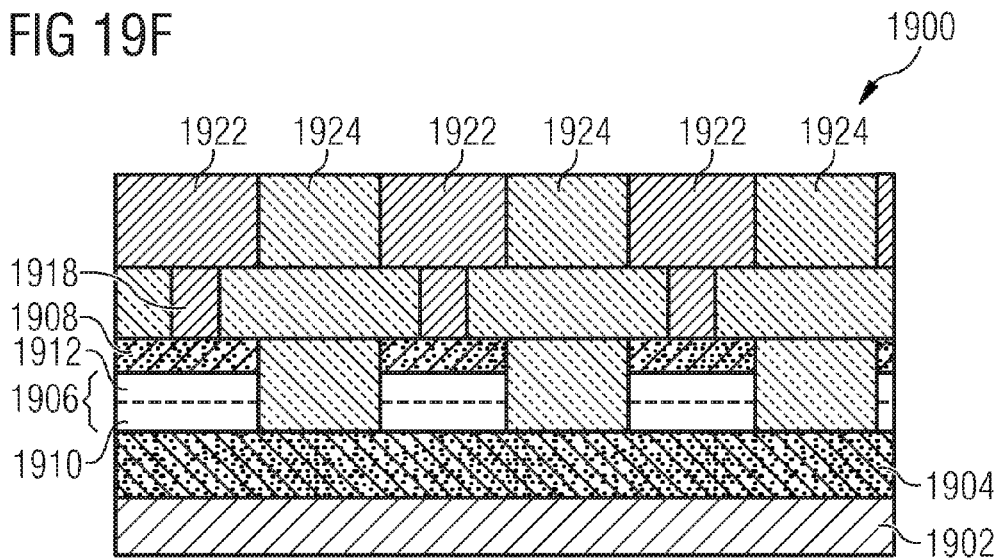

As shown in FIG. 19F, bit lines 1922 may be formed in electrical contact with the resistivity changing memory element 1918. The bit lines 1922 may include a metal or other conductive material, and may be formed using conventional techniques. The bit lines 1922 may be surrounded by an insulating material 1924, such as an oxide.

Figure 20:
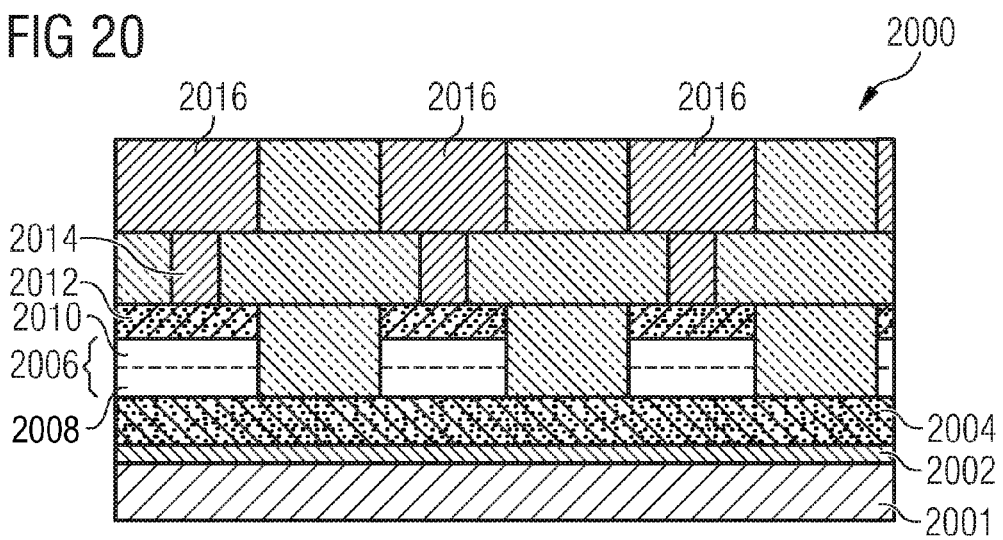
FIG. 20 shows an integrated circuit memory device in accordance with an embodiment of the invention.

FIG. 20 shows another embodiment, in which a buried refractory metal line 2002 lowers the word line resistance, while the carbon layer 2004 creates a proper semiconductor-carbon interface to form a carbon diode with the semiconductor layer 2006.

The integrated circuit structure 2000 shown in FIG. 20 includes the refractory metal line 2002, formed on an isolating substrate 2001. The carbon layer 2004 also serves (in combination with the refractory metal line 2002) as a word line. The semiconductor layer 2006 includes a low doped (n– or p–) sub-layer 2008 and a highly doped (n++ or p++) sub-layer 2010, and may include Si or other semiconductor materials. A second conductive carbon layer 2012 is in contact with the semiconductor layer 2006, and a resistivity changing memory element 2014 is formed in contact with the second conductive carbon layer 2012. Bit lines 2016, which may include a metal or other conductive material, may be formed in electrical contact with the resistivity changing memory element 2014.

Figure 21A:
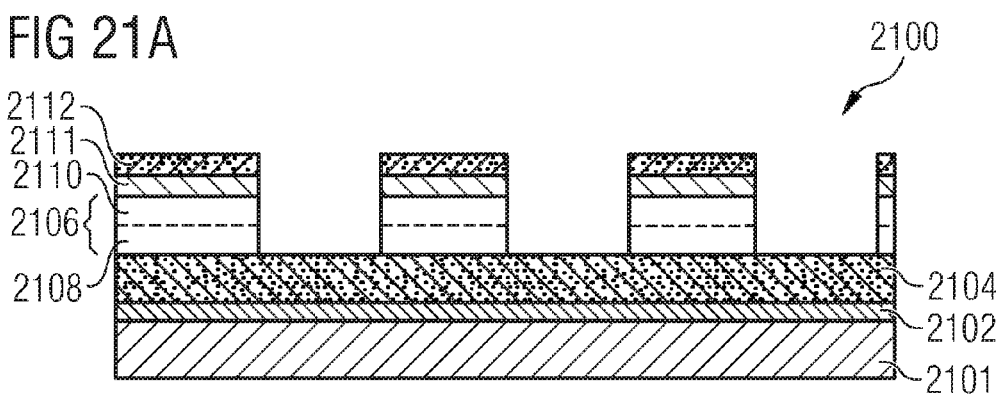
FIGS. 21A and 21B show an embodiment including a refractory silicide layer.
Figure 21B:
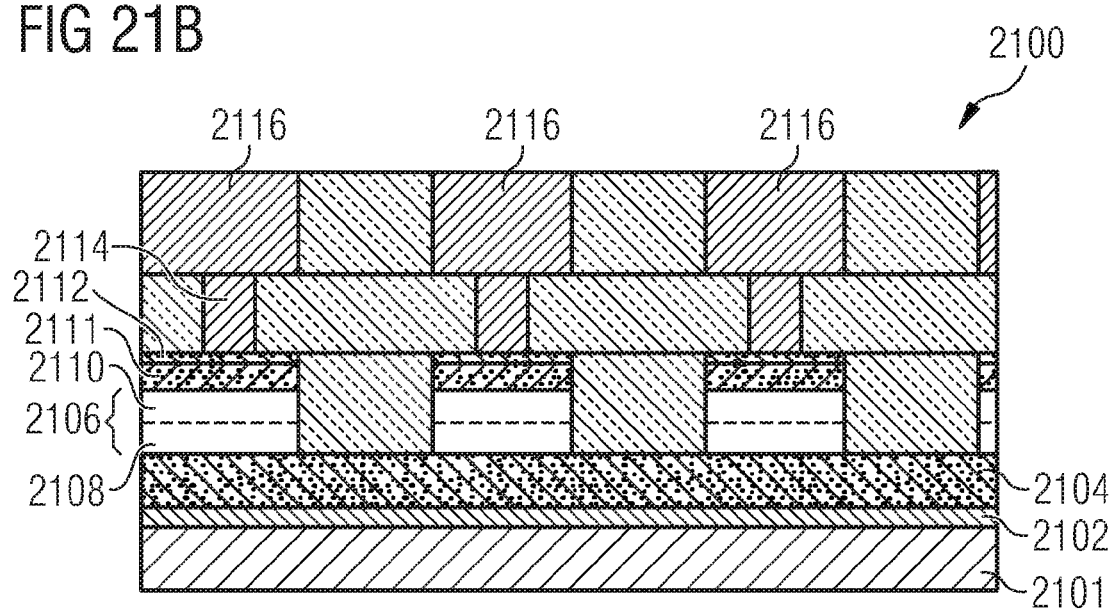

FIGS. 21A and 21B show an embodiment in which a refractory silicide forming metal is deposited on top of the semiconductor layer. During the anneal, a silicide will form, improving the ohmic contact in some embodiments.

FIG. 21A shows the integrated circuit of this embodiment following the anneal. The integrated circuit structure 2100 includes a refractory metal line 2102, formed on an isolating substrate 2101. A carbon layer 2104 also serves (in combination with the refractory metal line 2102) as a word line, and forms a carbon Schottky diode where it contacts a semiconductor layer 2106. The semiconductor layer 2106, which may be in a single crystal form following the anneal, includes a low doped (n– or p–) sub-layer 2108 and a highly doped (n++ or p++) sub-layer 2110, and may include Si or other semiconductor materials. A silicide layer 2111 is formed above the semiconductor layer 2106, to improve ohmic contact. A second conductive carbon layer 2112 is in contact with the semiconductor layer 2106.

FIG. 21B shows the integrated circuit following the formation of resistivity changing memory elements 2114 and bit lines 2116. The resistivity changing memory elements 2114 and bit lines 2116 are similar to those shown in other embodiments, and may be formed in a similar manner.

Figure 22:
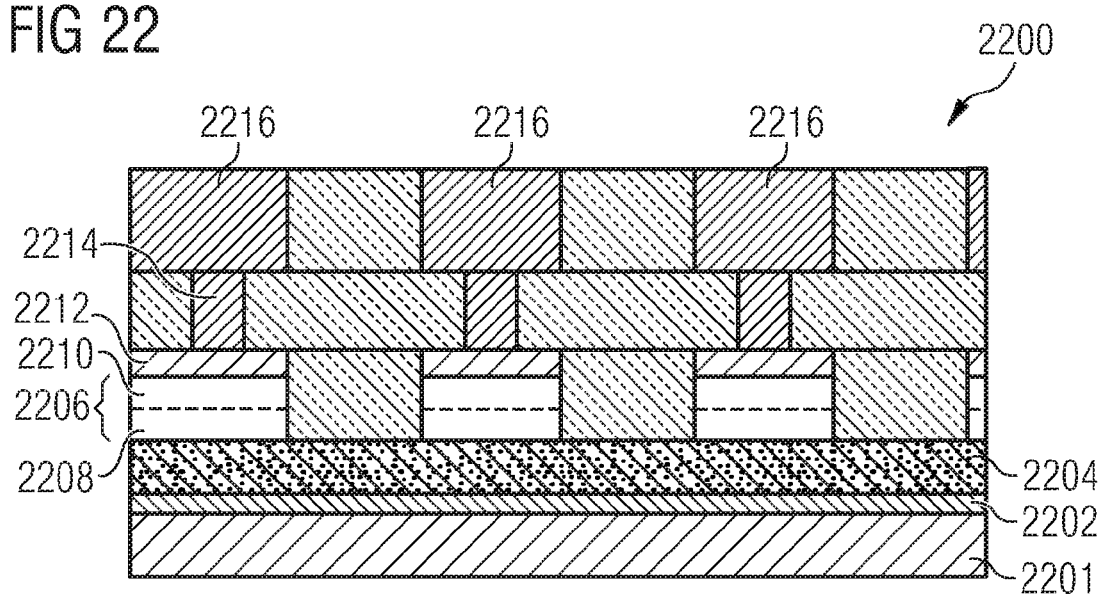
FIG. 22 shows another integrated circuit memory device in accordance with an embodiment of the invention.

As shown in FIG. 22, another embodiment may omit the second conductive carbon layer. The integrated circuit structure 2200 shown in FIG. 22 includes a refractory metal line 2202, formed on an isolating substrate 2201. A carbon layer 2204 also serves (in combination with the refractory metal line 2202) as a word line, and forms a carbon Schottky diode where it contacts a semiconductor layer 2206. The semiconductor layer 2206 includes a low doped (n– or p–) sub-layer 2208 and a highly doped (n++ or p++) sub-layer 2210, and may include Si or other semiconductor materials. A silicide layer 2212 is in contact with the semiconductor layer 2206, and a resistivity changing memory element 2214 is formed in contact with the silicide layer 2212. Bit lines 2216, which may include a metal or other conductive material, may be formed in electrical contact with the resistivity changing memory element 2014.

Figure 23:
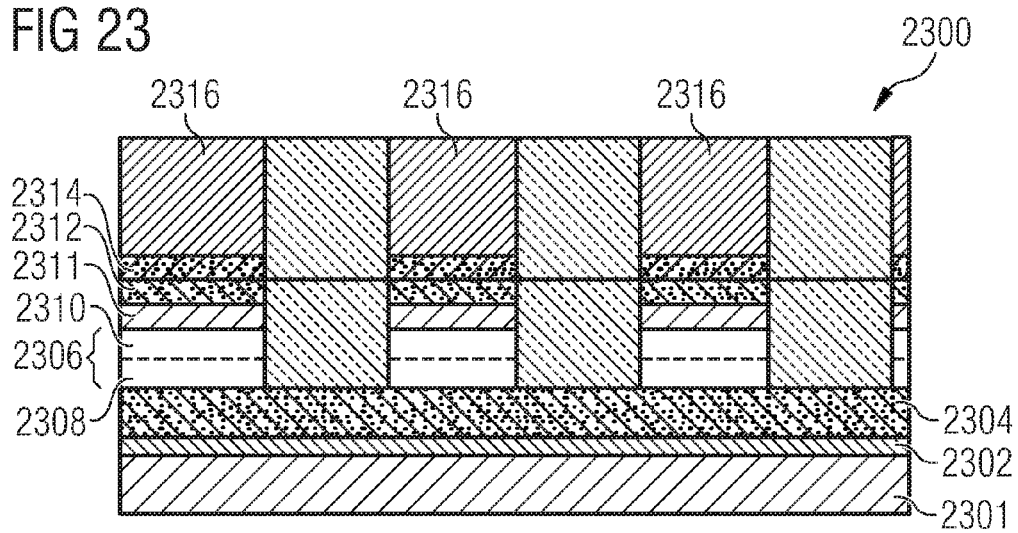
FIG. 23 shows a further integrated circuit memory device in accordance with an embodiment of the invention.

FIG. 23 shows a further embodiment, in which carbon filament memory elements, such as are shown above in FIGS. 3A and 3B are used for the resistivity changing memory elements. The integrated circuit structure 2300 includes a refractory metal line 2302, formed on an isolating substrate 2301. A carbon layer 2304 also serves (in combination with the refractory metal line 2302) as a word line, and forms a carbon Schottky diode where it contacts a semiconductor layer 2306. The semiconductor layer 2306 includes a low doped (n– or p–) sub-layer 2308 and a highly doped (n++ or p++) sub-layer 2310, and may include Si or other semiconductor materials. A silicide layer 2311 is formed in contact with the semiconductor layer 2306, and a second conductive carbon layer 2312 is formed above the silicide layer 2311. An insulating carbon layer 2314 forms the core of a carbon filament resistivity changing memory element. In some embodiments, to facilitate direct contact with a metal bit line 2316, the top of the insulating carbon layer 2314 may be graphitized by a laser pulse, ion bombardment, or other similar techniques. Bit lines 2316, which may include a metal or other conductive material, may be formed in electrical contact with the insulating carbon layer 2314.

Figure 24:
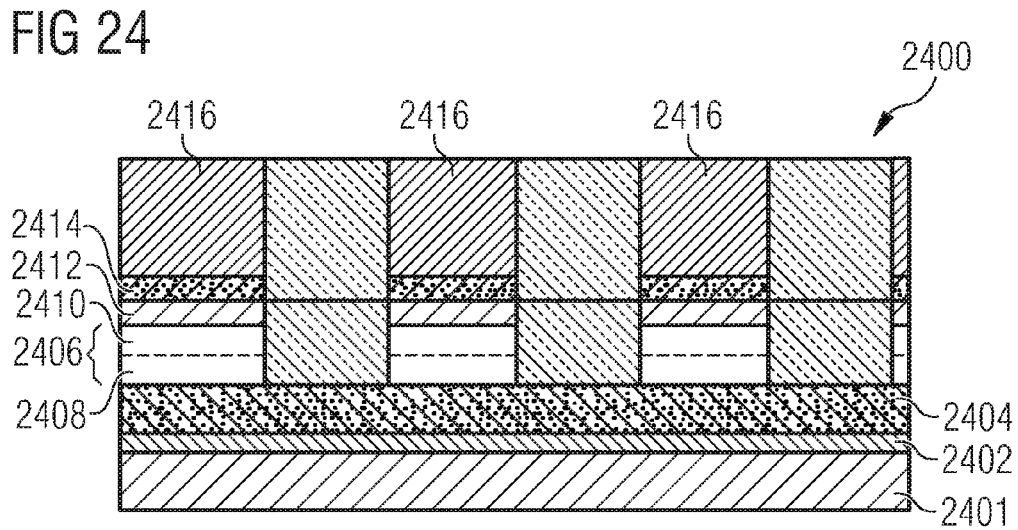
FIG. 24 shows yet another integrated circuit memory device in accordance with an embodiment of the invention.

As shown in FIG. 24, a similar embodiment that uses a carbon filament resistivity changing memory device, but that omits the second conductive carbon layer may also be formed. The integrated circuit structure 2400 shown in FIG. 24 includes a refractory metal line 2402, formed on an isolating substrate 2401. A carbon layer 2404 also serves (in combination with the refractory metal line 2402) as a word line, and forms a carbon Schottky diode where it contacts a semiconductor layer 2406. The semiconductor layer 2406 includes a low doped (n– or p–) sub-layer 2408 and a highly doped (n++ or p++) sub-layer 2410, and may include Si or other semiconductor materials. A silicide layer 2412 is in contact with the semiconductor layer 2406, and an insulating carbon layer 2414, which is used as a carbon filament resistivity changing memory element, is formed in contact with the silicide layer 2412. Bit lines 2416, which may include a metal or other conductive material, may be formed in electrical contact with the insulating carbon layer 2414.

Figure 25:
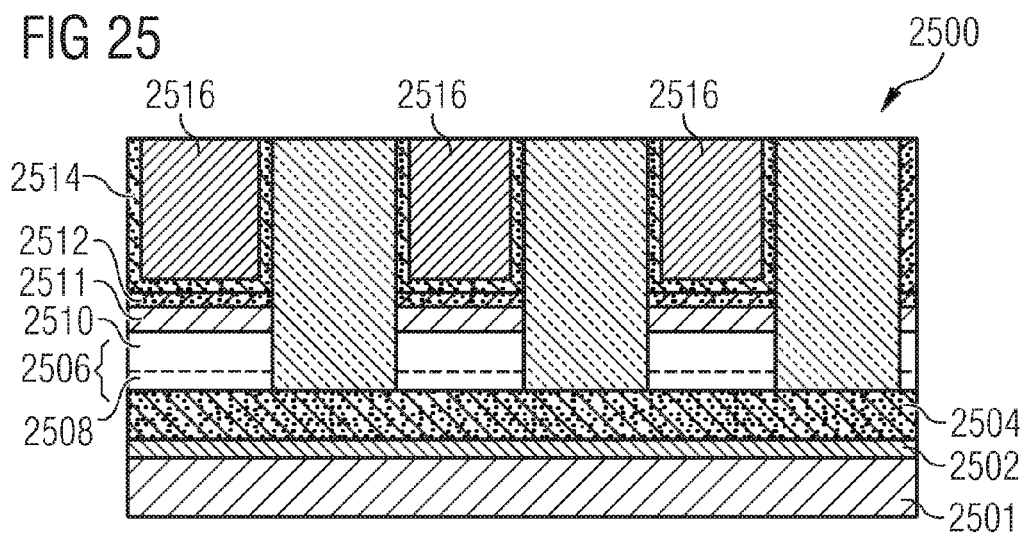
FIG. 25 shows another integrated circuit memory device, using a dual damascene approach, in accordance with an embodiment of the invention.

Similar embodiments may also be formed using a dual damascene approach, as shown in FIG. 25. The integrated circuit structure 2500 includes a refractory metal line 2502, formed on an isolating substrate 2501. A carbon layer 2504 also serves (in combination with the refractory metal line 2502) as a word line, and forms a carbon Schottky diode where it contacts a semiconductor layer 2506. The semiconductor layer 2506 includes a low doped (n− or p−) sub-layer 2508 and a highly doped (n++ or p++) sub-layer 2510, and may include Si or other semiconductor materials. A silicide layer 2511 is formed in contact with the semiconductor layer 2506, and a second conductive carbon layer 2512 is formed above the silicide layer 2511. An insulating carbon layer 2514 is formed lining the walls of a trench, in contact with the silicide layer 2511. The insulating carbon layer 2514 is used as a carbon filament resistivity changing memory element. The trench is filled with a conductive material 2516, and the integrated circuit 2500 may be planarized using CMP or other conventional planarization techniques. The conductive material 2516, which may be a metal or other conductive material, forms bit lines in electrical contact with the insulating carbon layer 2514.

In some embodiments, the memory arrays can be stacked on a single integrated substrate, to form a three dimensional memory array, increasing the number of memory cells on an integrated circuit memory device. A schematic representation of such a device is shown in FIG. 26.

Figure 26:
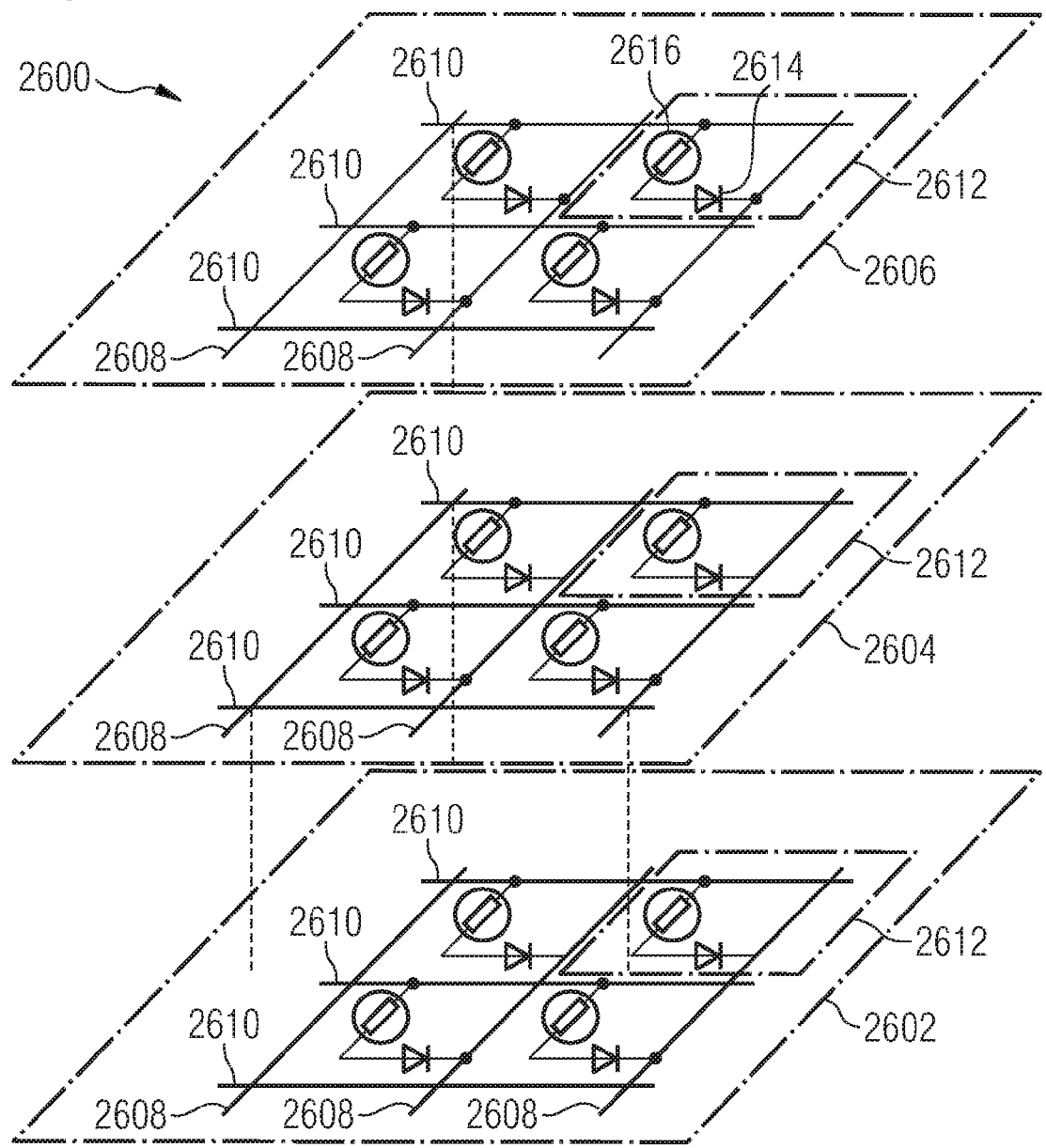
FIG. 26 shows a schematic representation of a three dimensional array of memory cells in accordance with an embodiment of the invention.

In FIG. 26, a three dimensional array 2600 having three "levels" 2602, 2604, and 2606 is shown. Each such "level" includes a two dimensional memory array having bit lines 2608, word lines 2610, and memory cells 2612. According to an embodiment of the invention, each memory cell 2612 may include a carbon diode 2614 as a selection device, and a resistivity changing memory element 2616, such as a carbon memory element, a phase changing memory element, a conductive bridging memory element, a TMO memory element, an MRAM memory element, or other types of resistivity changing memory elements.

Figure 27A:
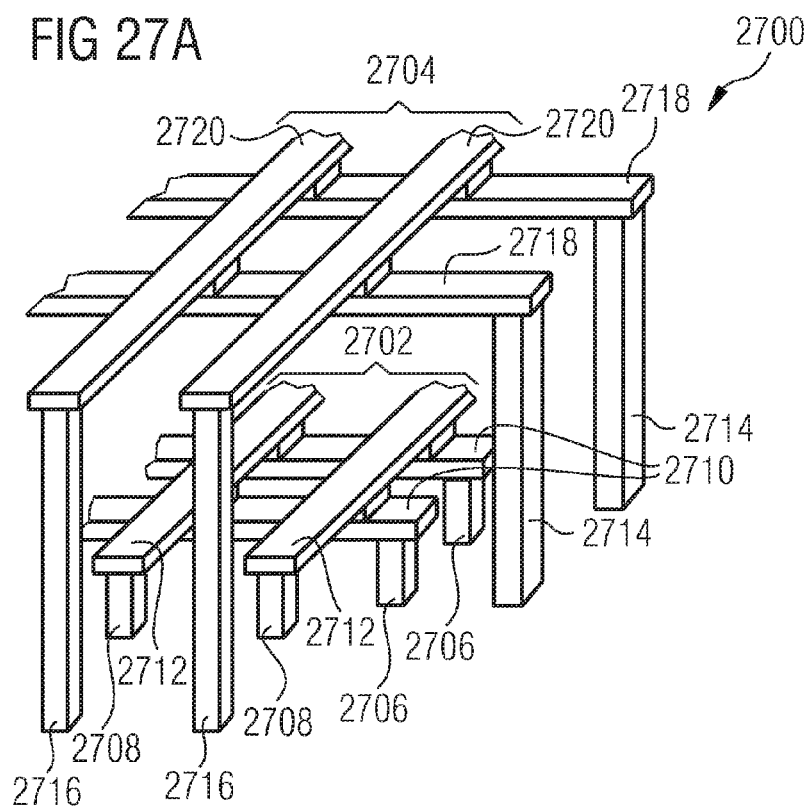
FIGS. 27A-27C show views of various three dimensional arrays of memory cells in accordance with embodiments of the invention.
Figure 27B:
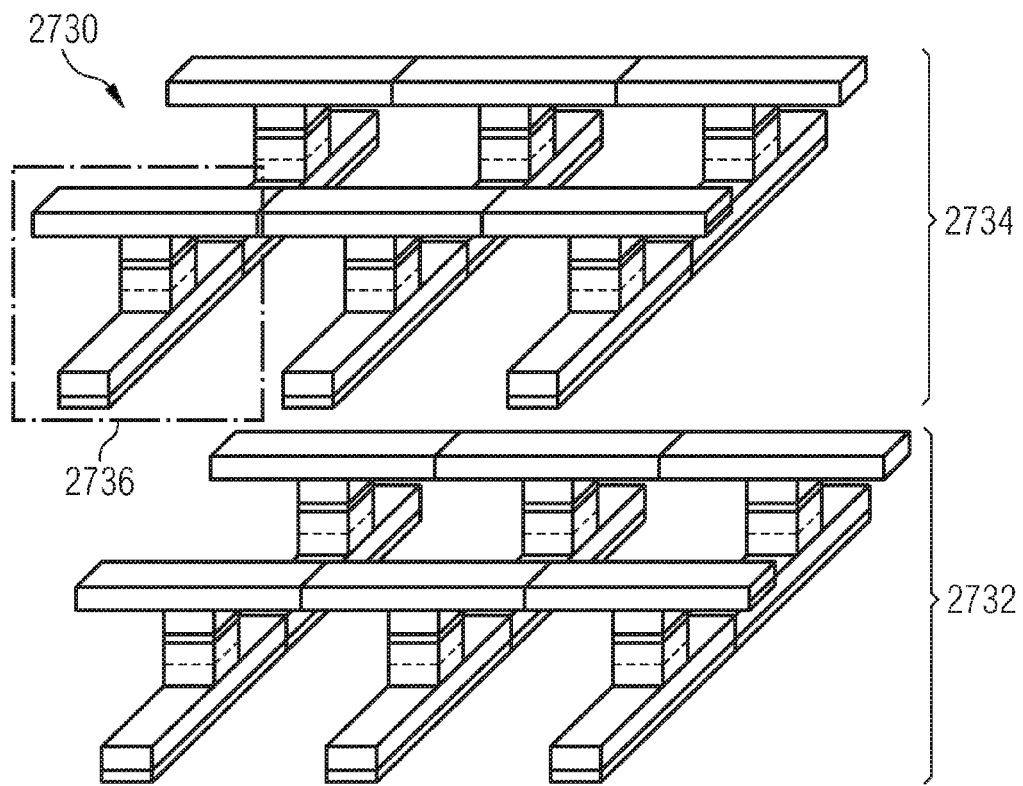
Figure 27C:
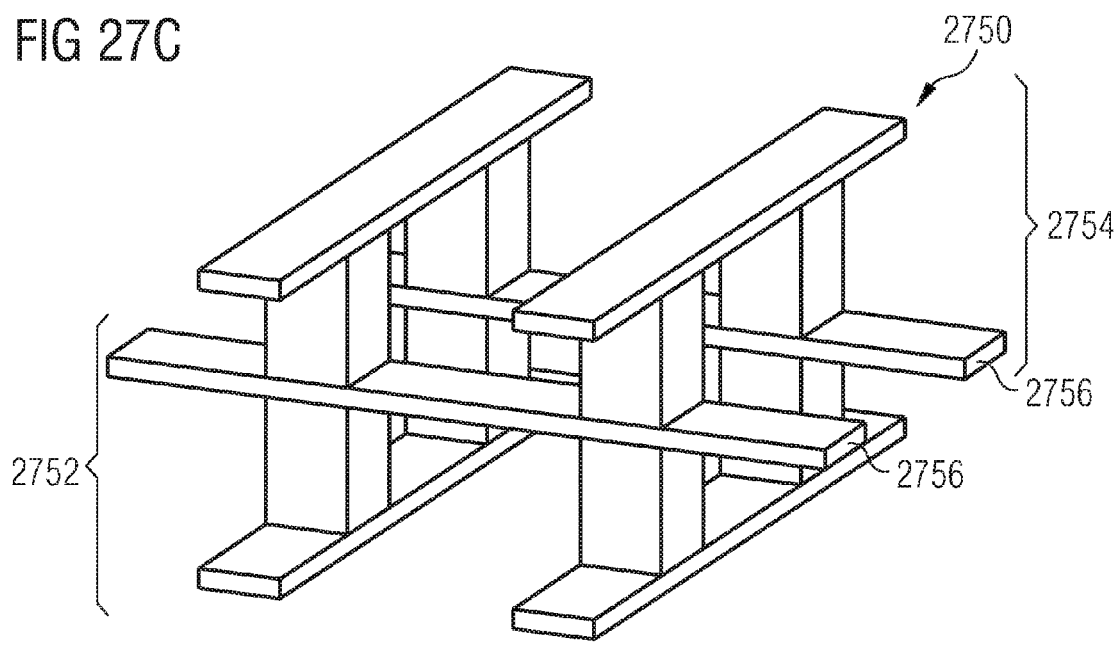

FIGS. 27A-27C show further views of such three dimensional arrays. In FIG. 27A, an array 2700 having two levels 2702 and 2704 is shown. As can be seen, vias 2706 and 2708 connect to the word lines 2710 and bit lines 2712 of the first level 2702, and vias 2714 and 2716 connect to the word lines 2718 and bit lines 2720 of the second level 2704.

In FIG. 27B, a three dimensional array 2730 is shown, having two levels 2732 and 2734, each of which includes memory cells 2736 similar to those discussed above with reference to FIGS. 17A, 17B, and 18. The ability to form such layers above most any isolating structure, such as is described above, provides an ability to form three dimensional arrays having an arbitrary number of levels.

As shown in FIG. 27C, where there are two levels (or in some embodiments, an even number of levels), a shared-bit line design may be used. The array 2750 includes two levels 2752 and 2754. Both levels 2752 and 2754 use the same shared bit lines 2756. In some embodiments, this two-level shared bit line structure can be stacked (with isolation layers between pairs of levels) to create arrays having more than two levels.

Figure 28A:
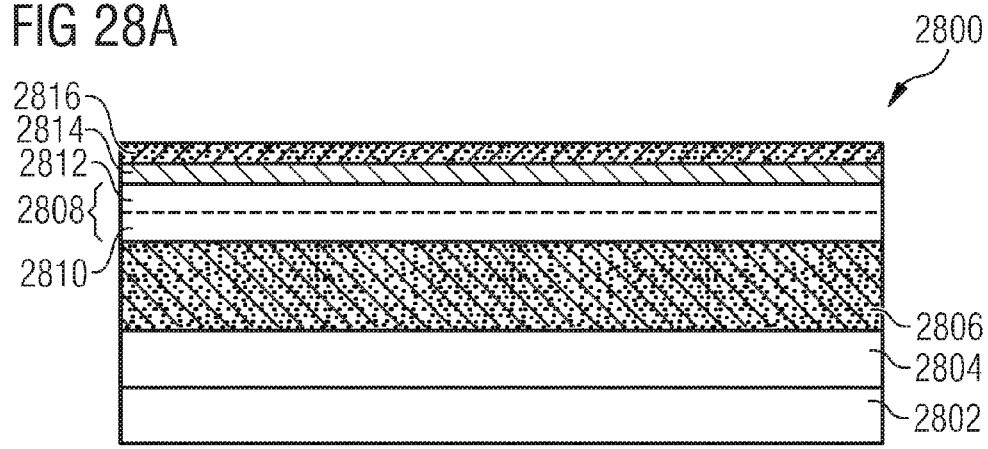
FIGS. 28A-28D illustrate a method of forming a three dimensional array of memory cells in accordance with an embodiment of the invention.

FIGS. 28A-28D show a method of forming a three dimensional array such as is shown in FIG. 27B, having at least two levels. FIG. 28A shows the start of the formation of a first level of an integrated circuit 2800, in which a highly doped (n++ or p++) semiconductor layer 2804 is formed on a substrate 2802 of the opposite doping type (e.g., the substrate 2802 is p-doped if the highly doped semiconductor layer 2804 is n++ doped). A conductive carbon layer 2806 is formed above the highly doped semiconductor layer 2804. In combination, the highly doped semiconductor layer 2804 and conductive carbon layer 2806 will serve as a word line, when correctly structured. Alternatively, on an isolating substrate or layer, the word line could be formed by just a conductive carbon layer, or by a refractory metal layer and a conductive carbon layer, as described above with reference to various embodiments. In some embodiments, the highly doped semiconductor layer 2804 includes Si, or other semiconductor materials. In some embodiments, the conductive carbon layer 2806 includes pyrolytic carbon, or other sp$^2$-rich carbon.

Above the conductive carbon layer 2806, a semiconductor layer 2808 is formed, having two sub-layers 2810 and 2812. The first sub-layer 2810 is a low doped sub-layer, having a doping concentration of approximately $10^{15}$ to approximately $10^{18}$. The second sub-layer 2812 is a highly doped sub-layer, having a doping concentration of approximately $10^{18}$ to approximately $10^{20}$. The contact between the conductive carbon layer 2806 and the low doped sub-layer 2810 of the semiconductor layer 2808 forms a carbon Schottky diode, which may be used as a selection device for a resistivity changing memory cell.

In some embodiments, a refractory silicide layer 2814 may be formed on top of the highly doped sub-layer 2812. A second conductive carbon layer 2816 may be formed above the silicide layer 2814. As shown in the many embodiments described above, there may be many variations on this structure in various embodiments. For example, the refractory silicide layer 2814 may be omitted in some embodiments, or the second conductive carbon layer 2816 may be replaced by a metal layer or by another conductive material.

Figure 28B:
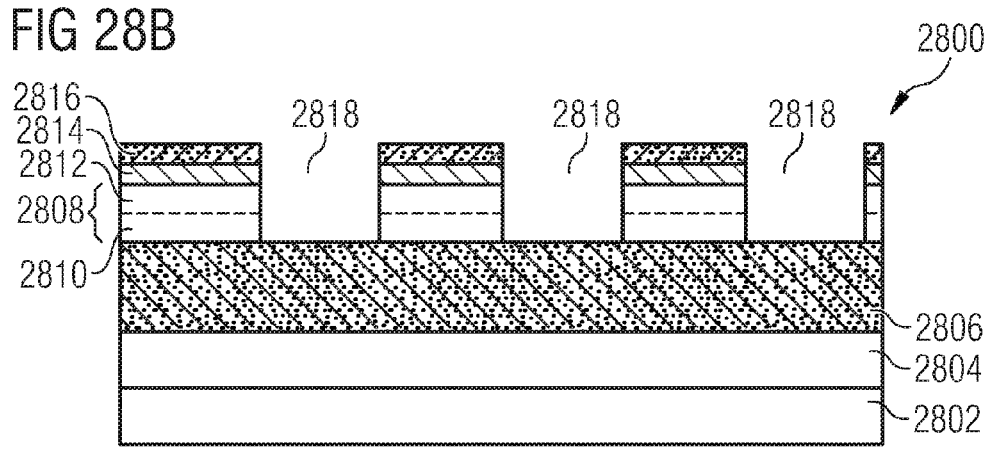

As shown in FIG. 28B, the integrated circuit 2800 is structured by forming trenches 2818. Such trenches may be formed in two parallel directions (not shown in this view) to obtain the isolated word lines and the semiconductor piles including the semiconductor layer 2808, silicide layer 2814, and second conductive carbon layer 2816. This structuring may be achieved using a conventional technique, such as a hard mask etch technique.

Figure 28C:
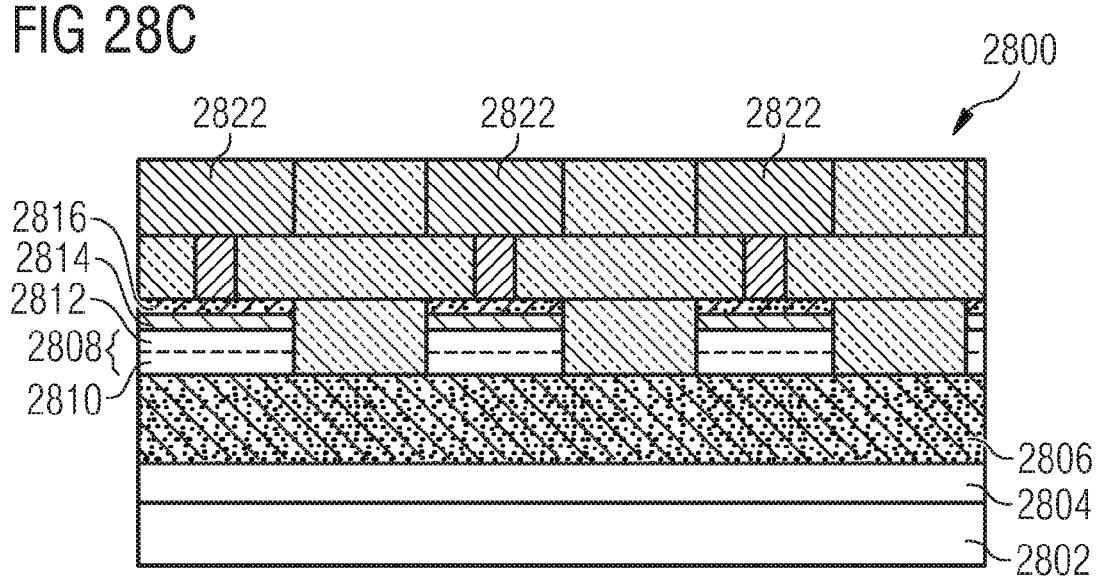

As shown in FIG. 28C, a resistivity changing memory element 2820, which may include a resistance changeable material, is formed in contact with the second conductive carbon layer 2816. In some embodiments, the resistivity changing memory element 2820 may be formed in a sub-lithographic structure. In some embodiments, the resistivity changing memory element may be a carbon memory element, formed of a layer of insulating carbon, as shown in some of the embodiments discussed above. FIG. 28C also shows bit lines 2822, which may be formed in electrical contact with the resistivity changing memory elements 2820. The bit lines 2822 may include a metal or other conductive material, and may be formed using conventional techniques. An insulating material 2824, such as an oxide may be used to fill areas surrounding the various structures of the integrated circuit 2800.

Figure 28D:
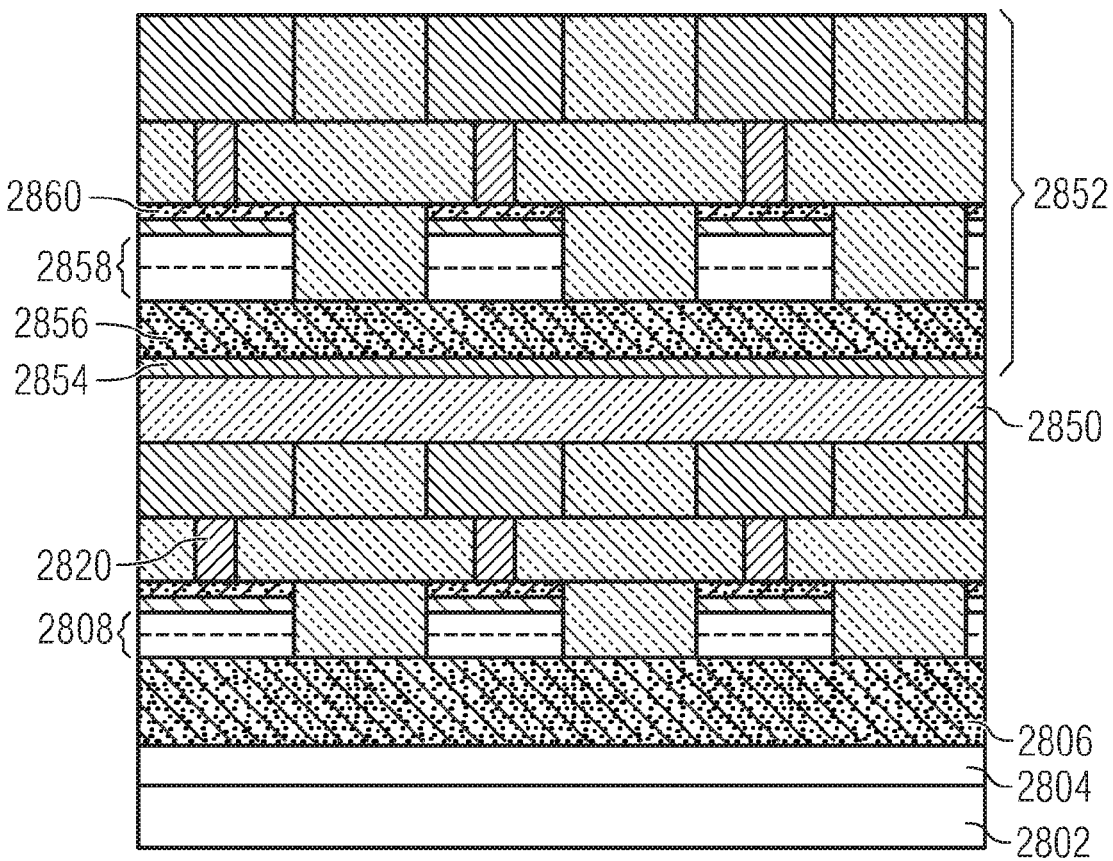

As shown in FIG. 28D, an isolation layer 2850, which may include an insulating material, such as an oxide, is then formed over the memory array, and another, similar second memory array 2852 may be formed in layers above the isolation layer 2850. In the example embodiment shown in FIG. 28D, the second memory array 2852 is similar to the embodiment described above with reference to FIG. 21B. A refractory metal layer 2854 lowers the resistance of the conductive carbon word line 2856, and in which a silicide layer 2860 is used above the semiconductor layer 2858. It will be recognized that the many embodiments and variations described above could be used in a three dimensional memory array such as is shown in the integrated circuit 2800, and that additional levels may be added to the array.

Figure 29A:
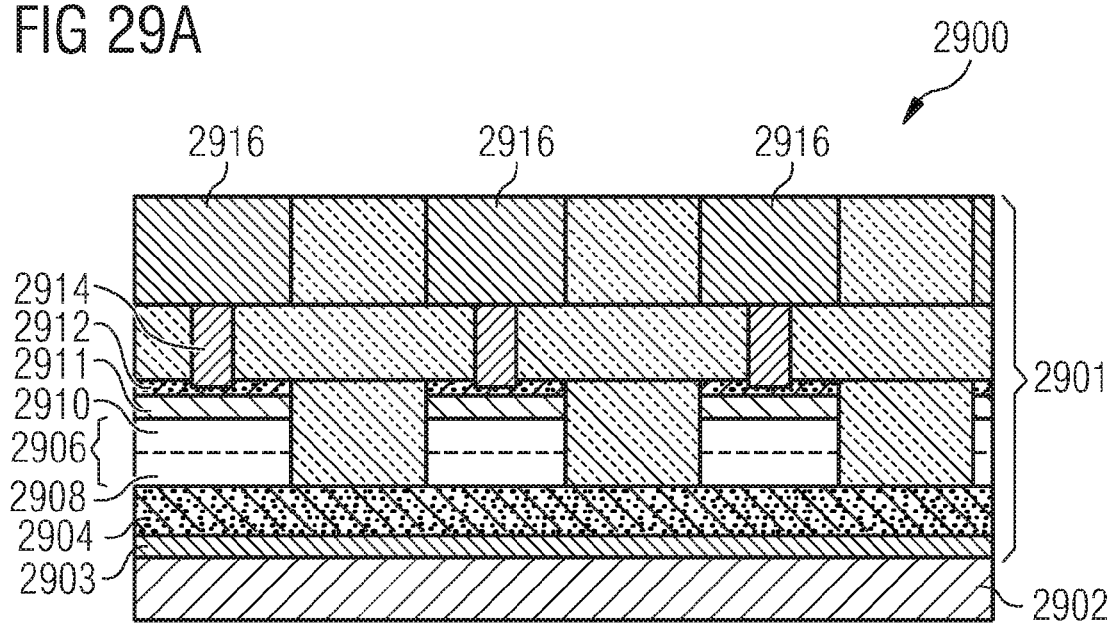
FIGS. 29A and 29B show an embodiment of a three dimensional array of memory cells having shared bit lines in accordance with an embodiment of the invention.
Figure 29B:
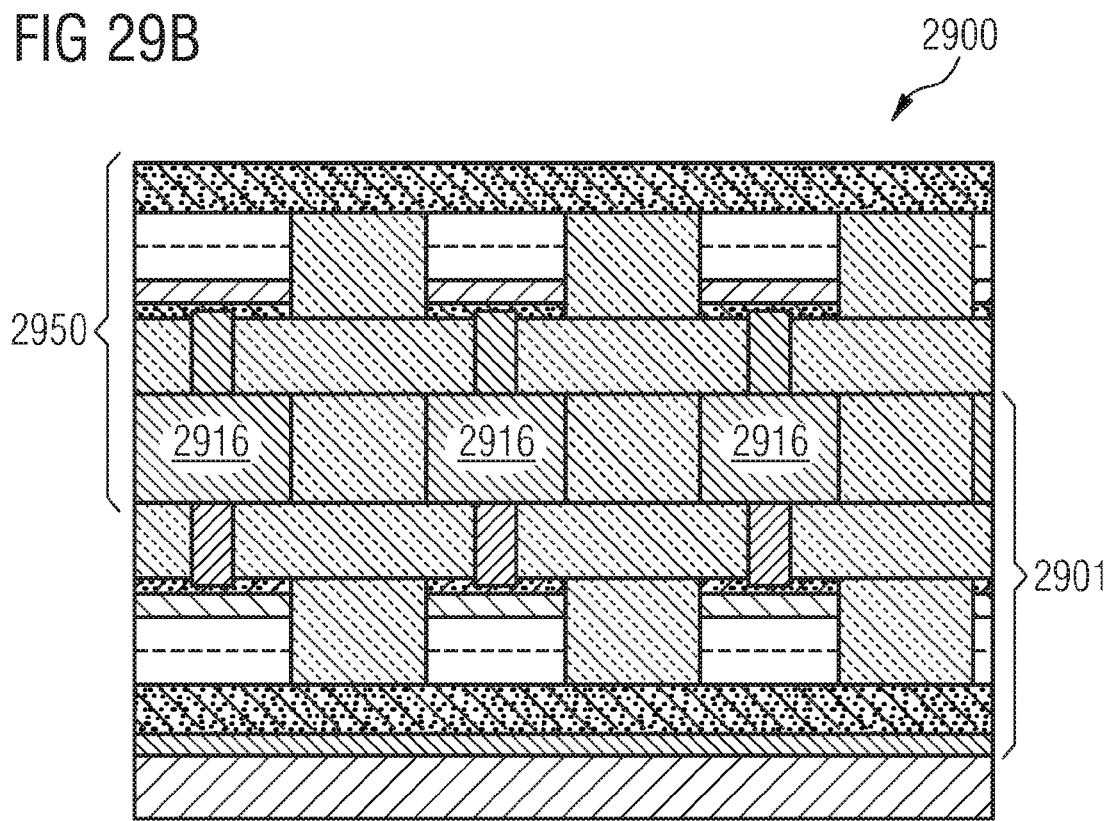

FIGS. 29A and 29B show an embodiment of an integrated circuit 2900, including a three dimensional memory array having shared bit lines. In FIG. 29A a first level 2901 is shown, including substantially the same structure as is described above with reference to FIGS. 21A and 21B. The first level 2901 includes a refractory metal line 2903, formed on an isolating substrate 2902. A carbon layer 2904 also serves (in combination with the refractory metal line 2903) as a word line, and forms a carbon Schottky diode where it contacts a semiconductor layer 2906. The semiconductor layer 2906, which may be in a single crystal form following an anneal, includes a low doped (n− or p−) sub-layer 2908 and a highly doped (n++ or p++) sub-layer 2910, and may include Si or other semiconductor materials. A silicide layer 2911 is formed above the semiconductor layer 2906, to improve ohmic contact. A second conductive carbon layer 2912 is in contact with the semiconductor layer 2906. Resistivity changing memory elements 2914 and bit lines 2916 are formed above the silicide layer 2911. The resistivity changing memory elements 2914 may include a carbon memory element including, for example, an insulation carbon layer. Alternatively, the resistivity changing memory elements 2914 may include a phase changing memory element, a TMO memory element, a conductive bridging memory element, an MRAM memory element, or another type of resistivity changing memory element.

As shown in FIG. 29B, a mirror image of the structure of the first level 2901 may be used to form a second level 2950, which shares the bit lines 2916 with the first level 2901. It will be recognized that many of the various embodiments and variations described above may be used to form a similar shared bit line three dimensional embodiments, and that further levels may be added in pairs using similar shared bit line structures, or individually, using structures such as are described above with reference to FIGS. 28A-28D.

Figure 30A:
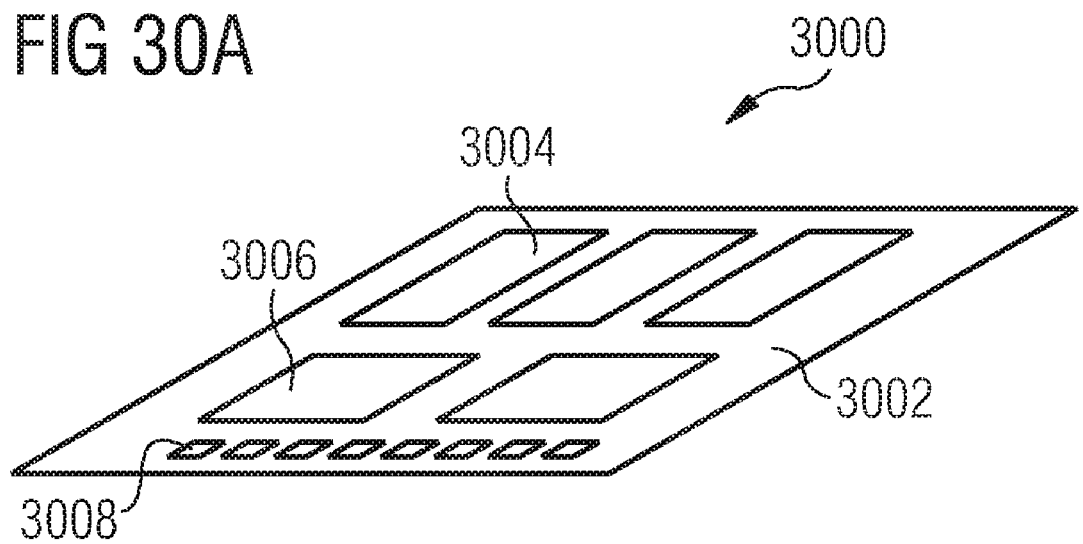
FIGS. 30A and 30B show a memory module that may include an integrated circuit memory device according to an embodiment of the invention.
Figure 30B:
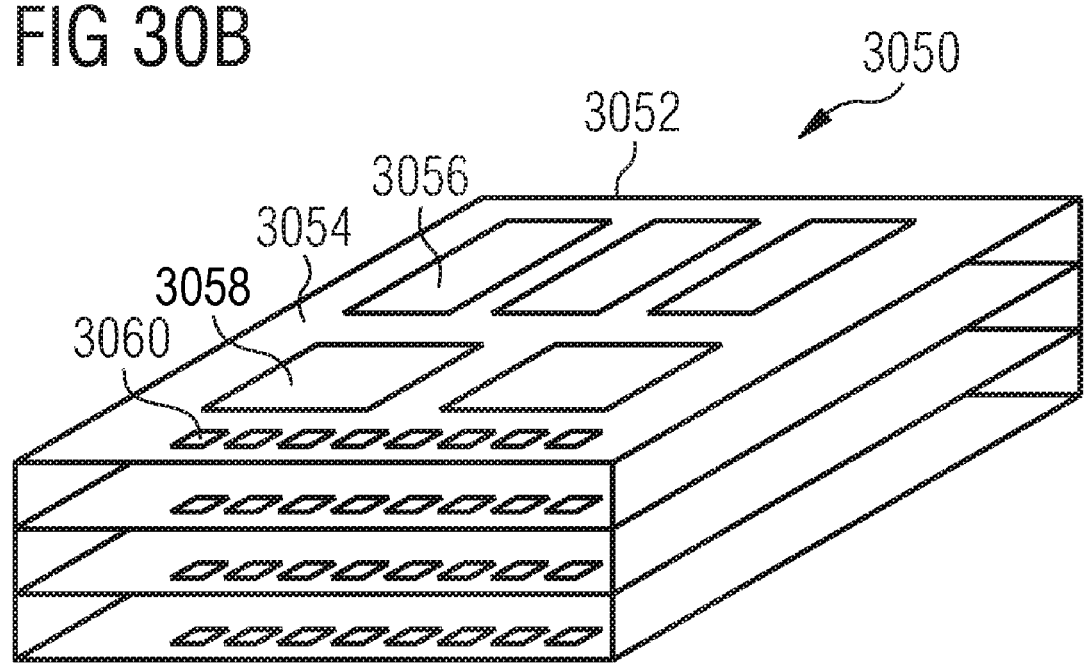

Memory arrays formed in accordance with an embodiment of the invention may be used in a variety of memory devices. As shown in FIGS. 30A and 30B, in some embodiments, memory devices such as those described herein may be used in modules. In FIG. 30A, a memory module 3000 is shown, on which one or more memory devices 3004 are arranged on a substrate 3002. Each memory device 3004 may include a memory array in accordance with an embodiment of the invention. The memory module 3000 may also include one or more electronic devices 3006, which may include memory, processing circuitry, control circuitry, addressing circuitry, bus interconnection circuitry, or other circuitry or electronic devices that may be combined on a module with a memory device 3004. Additionally, the memory module 3000 includes multiple electrical connections 3008, which may be used to connect the memory module 3000 to other electronic components, including other modules. For example, the memory module 3000 may be plugged into a larger circuit board, including PC main boards, video adapters, cell phone circuit boards or portable video or audio players, among others.

As shown in FIG. 30B, in some embodiments, these modules may be stackable, to form a stack 3050. For example, a stackable memory module 3052 may include one or more memory devices 3056, arranged on a stackable substrate 3054. Each of the memory devices 3056 includes a memory array in accordance with an embodiment of the invention. The stackable memory module 3052 also may include one or more electronic devices 3058, which may include memory, processing circuitry, control circuitry, addressing circuitry, bus interconnection circuitry, or other circuitry or electronic devices that may be combined on a module with a memory device 3056. Electrical connections 3060 are used to connect the stackable memory module 3052 with other modules in the stack 3050, or with other electronic devices. Other modules in the stack 3050 may include additional stackable memory modules, similar to the stackable memory module 3052 described above, or other types of stackable modules, such as stackable processing modules, control modules, communication modules, or other modules containing electronic components.

Thus, in one embodiment an integrated circuit is provided, including a memory cell including a resistivity changing memory element and a carbon diode electrically coupled to the resistivity changing memory element. In some such embodiments, the carbon diode includes a carbon Schottky diode formed at an interface between a semiconductor material and a conductive carbon material. In some embodiments, the semiconductor material includes silicon, though it will be understood that other semiconductor materials may be used. In some embodiments, the conductive carbon material comprises pyrolytic carbon or another $sp^2$-rich carbon material. In some embodiments, the resistivity changing memory element may include a carbon memory element, a phase changing memory element, a conductive bridging memory element, a transition metal oxide memory element, or a magnetoresistive memory element. In some embodiments, the memory cell is formed above an epitaxial semiconductor substrate. In some embodiments, the memory cell may be formed above an isolating surface.

In one embodiment, an integrated circuit is provided, including an array of memory cells, wherein a memory cell in the array of memory cells includes a resistivity changing memory element, and a carbon diode coupled to the resistivity changing memory element. In some such embodiments, the carbon diode includes a carbon Schottky diode formed at an interface between a semiconductor material and a conductive carbon material. In some embodiments, the semiconductor material includes silicon, though other semiconductor materials may be used. In some embodiments, the conductive carbon material includes pyrolytic carbon or another $sp^2$-rich carbon material. In some embodiments, the resistivity changing memory element comprises a carbon memory element, a phase changing memory element, a conductive bridging memory element, a transition metal oxide memory element, or a magnetoresistive memory element.

In some embodiments, the array of memory cells is formed in a first level, and the integrated circuit further includes a second array of memory cells formed in a second level. In some such embodiments, the array of memory cells and the second array of memory cells share a bit line.

In another embodiment, a method of manufacturing an integrated circuit is provided. The method includes providing a substrate, forming a carbon diode above the substrate, and forming a resistivity changing memory element electrically coupled to the carbon diode. In some embodiments, forming the carbon diode further includes forming a semiconductor layer, doping the semiconductor layer, and forming a conductive carbon layer in contact with the semiconductor layer. In some such embodiments, doping the semiconductor layer includes doping a first sub-layer of the semiconductor layer to a high doping concentration and doping a second sub-layer of the semiconductor layer to a low doping concentration, and forming a conductive carbon layer in contact with the semiconductor layer includes forming the conductive carbon layer in contact with the second sub-layer of the semiconductor layer.

In some embodiments, providing a substrate includes providing an epitaxial semiconductor substrate. In such embodiments, forming a semiconductor layer may include forming the semiconductor layer with a first surface in contact with the substrate, and structuring the semiconductor layer so that at least a portion of the semiconductor layer forms a word line. Additionally, forming a conductive carbon layer may include forming the conductive carbon layer in contact with a second surface of the semiconductor layer.

In other embodiments, forming a conductive carbon layer comprises forming the conductive carbon layer above an isolating surface and structuring the conductive carbon layer so that at least a portion of the conductive carbon layer forms a word line. In some such embodiments, forming a semiconductor layer includes forming the semiconductor layer above the conductive carbon layer. Some embodiments further include forming a metal layer between the isolating surface and the conductive carbon layer, the metal layer structured to form a part of the word line.

In some embodiments, forming the resistivity changing memory element includes forming a carbon memory element, a phase changing memory element, a conductive bridging memory element, a transition metal oxide memory element, or a magnetoresistive memory element. In some embodiments, an additional metal layer may be formed in contact with the resistivity changing memory element. In some embodiments, an additional conductive carbon layer may be formed in contact with the resistivity changing memory element. In some embodiments, an additional silicide layer may be formed. Some embodiments may be formed using a dual damascene process.

In another embodiment, a method of manufacturing an integrated circuit is provided, including forming a first array of memory cells in a first level, wherein a memory cell in the first array of memory cells includes a resistivity changing memory element, and a carbon diode coupled to the resistivity changing memory element. In some embodiments, the method further includes forming a second array of memory cells in a second level, wherein a memory cell in the second array of memory cells includes a resistivity changing memory element, and a carbon diode coupled to the resistivity changing memory element. In some such embodiments, forming the first array of memory cells includes forming a bit line, and forming the second array of memory cells includes sharing the bit line with the first array of memory cells.

In still another embodiment, a memory module is provided, including a multiplicity of integrated circuits, wherein said integrated circuits include an array of memory cells, wherein a memory cell in the array of memory cells includes a resistivity changing memory element, and a carbon diode coupled to the resistivity changing memory element. In some embodiments, the memory modules are stackable.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
a resistivity changing memory element comprising a carbon memory element, a phase changing memory element, a conductive bridging memory element, a transition metal oxide memory element, or a magnetoresistive memory element; and
a carbon Schottky diode formed at an interface between a semiconductor material and a conductive carbon material, the carbon Schottky diode electrically coupled to the resistivity changing memory element, the resistivity changing memory element and the carbon Schottky diode forming a memory cell.

2. The integrated circuit of claim 1, wherein the semiconductor material comprises silicon.

3. The integrated circuit of claim 1, wherein the conductive carbon material comprises an sp2-rich carbon material.

4. The integrated circuit of claim 1, wherein the memory cell is formed over an epitaxial semiconductor substrate.

5. The integrated circuit of claim 1, comprising an array of memory cells, the memory cell being part of the array, wherein each memory cell in the array of memory cells comprises a resistivity changing memory element comprising a carbon memory element, a phase changing memory element, a conductive bridging memory element, a transition metal oxide memory element, or a magnetoresistive memory element, and a carbon diode coupled to the resistivity changing memory element, wherein each carbon diode comprises a carbon Schottky diode formed at an interface between a semiconductor material and a conductive carbon material.

6. The integrated circuit of claim 5, wherein the conductive carbon material comprises an sp2-rich carbon material.

7. The integrated circuit of claim 5, wherein the array of memory cells is formed in a first level, and wherein the integrated circuit further comprises a second array of memory cells formed in a second level, and wherein the array of memory cells and the second array of memory cells share a bit line.

8. An integrated circuit comprising:
isolation trenches disposed in a substrate;
a word line disposed in the substrate;
a first doped region disposed between adjacent isolation trenches, the first doped region coupled to the word line;
a first conductive carbon layer disposed over the first doped region between the adjacent isolation trenches, the first conductive carbon layer contacting the first doped region thereby forming a carbon Schottky diode; and
a non-volatile resistance changing memory layer disposed over the first conductive carbon layer, the non-volatile resistance changing memory layer being electrically coupled to the first conductive carbon layer; and
a bit line disposed over the non-volatile resistance changing memory layer and electrically coupled to the non-volatile resistance changing memory layer.

9. The integrated circuit of claim 8, wherein the non-volatile resistance changing memory layer comprises a phase change memory material, a carbon memory material, a magnetoresistive memory material, an organic memory material, a conductive bridging memory element, or a transition metal oxide memory.

10. The integrated circuit of claim 8, further comprising a first refractory metal layer disposed between the non-volatile resistance changing memory layer and the first conductive carbon layer.

11. The integrated circuit of claim 10, wherein the non-volatile resistance changing memory layer comprises the first conductive carbon layer, an insulating carbon layer disposed over the first conductive carbon layer, the insulating carbon layer and the first refractory metal layer disposed between the adjacent isolation trenches.

12. The integrated circuit of claim 11, wherein the insulating carbon layer is a liner on an opening having sidewalls comprising the adjacent isolation trenches and a bottom surface having the first conductive carbon layer.

13. The integrated circuit of claim 11, further comprising a second refractory metal layer disposed between the first conductive carbon layer and the insulating carbon layer.

14. The integrated circuit of claim 13, wherein the insulating carbon layer is a liner on an opening having sidewalls comprising the adjacent isolation trenches and a bottom surface having the second refractory metal layer.

15. The integrated circuit of claim 11, wherein the non-volatile resistance changing memory layer further comprises a second conductive carbon layer disposed between the insulating carbon layer and the first refractory metal layer, the second conductive carbon layer disposed between the adjacent isolation trenches.

16. The integrated circuit of claim 8, wherein the non-volatile resistance changing memory layer physically contacts the first conductive carbon layer.

17. The integrated circuit of claim 8, wherein the non-volatile resistance changing memory layer comprises the first conductive carbon layer, an insulating carbon layer disposed over the first conductive carbon layer, and a second conductive carbon layer disposed over the insulating carbon layer, the insulating carbon layer and the second conductive carbon layer disposed between the adjacent isolation trenches.

18. An integrated circuit comprising:
   a word line comprising a first conductive carbon layer disposed in a substrate;
   isolation trenches disposed over the first conductive carbon layer in the substrate;
   a first doped region disposed over the first conductive carbon layer, the first doped region disposed between adjacent isolation trenches, wherein the first doped region and the first conductive carbon layer contact to form a carbon Schottky diode;
   a second doped region disposed over the first doped region, the second doped region having a higher doping of a same conductivity type than the first doped region; and
   a non-volatile resistance changing memory layer disposed over the second doped region, the non-volatile resistance changing memory layer being electrically coupled to the second doped region; and
   a bit line disposed over the non-volatile resistance changing memory layer and electrically coupled to the non-volatile resistance changing memory layer.

19. The integrated circuit of claim 18, further comprising a first refractory metal layer disposed under the first conductive carbon layer.

20. The integrated circuit of claim 18, further comprising a second conductive carbon layer disposed over the second doped region between the adjacent isolation trenches.

21. The integrated circuit of claim 20, further comprising a silicide layer disposed between the second doped region and the second conductive carbon layer.

22. The integrated circuit of claim 20, wherein the non-volatile resistance changing memory layer comprises an insulating carbon layer.

23. The integrated circuit of claim 22, wherein the insulating carbon layer is a liner on an opening having sidewalls comprising the adjacent isolation trenches and a bottom surface having the second conductive carbon layer.

* * * * *